(12) United States Patent
Cheng et al.

(10) Patent No.: US 8,178,387 B2
(45) Date of Patent: May 15, 2012

(54) METHODS FOR REDUCING RECRYSTALLIZATION TIME FOR A PHASE CHANGE MATERIAL

(75) Inventors: Huai-Yu Cheng, Hsinchu (TW); Simone Raoux, New York, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/756,043

(22) Filed: Apr. 7, 2010

(65) Prior Publication Data

US 2011/0097825 A1    Apr. 28, 2011

Related U.S. Application Data

(60) Provisional application No. 61/254,572, filed on Oct. 23, 2009.

(51) Int. Cl.
*H01L 21/06* (2006.01)
(52) U.S. Cl. .............. 438/102; 438/5; 438/95
(58) Field of Classification Search .......... 438/95, 438/102, 5
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 3,846,767 A | 11/1974 | Cohen |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |

(Continued)

FOREIGN PATENT DOCUMENTS

WO    2004025659 A1    3/2004

OTHER PUBLICATIONS

Zhou, Guo-Fu, "Materials aspects in phase change optical recording," 2001 Materials Science and Engineering A, 304-306, p. 73-80.*

(Continued)

*Primary Examiner* — Charles Garber
*Assistant Examiner* — Bryan Junge
(74) *Attorney, Agent, or Firm* — James F. Hann; Haynes Beffel & Wolfeld LLP

(57) ABSTRACT

A method for reducing recrystallization time for a phase change material of a memory cell element in conjunction with the manufacture of a memory cell device can be carried out as follows. A phase change material, a buffer layer material and a cladding layer material are selected. The buffer layer material is deposited on the substrate, the phase change material is deposited on the buffer layer, and the cladding layer material is deposited on the phase change material to form a memory cell element. The thickness of the phase change material is preferably less than 30 nm and more preferably less than 10 nm. The recrystallization time of the phase change material of the memory cell element is determined. If the recrystallization time is not less than a length of time X, these steps are repeated while changing at least one of the selected materials and material thicknesses.

9 Claims, 18 Drawing Sheets

U.S. PATENT DOCUMENTS

| | | |
|---|---|---|
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,477,135 B1 * | 11/2002 | Uno et al. .................. 369/275.2 |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen |
| 6,998,289 B2 | 2/2006 | Hudgens et al. |
| 7,023,008 B1 | 4/2006 | Happ |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |

| Patent/Pub No. | Date | Inventor |
|---|---|---|
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,262,502 B2 | 8/2007 | Chang |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,314,776 B2 | 1/2008 | Johnson et al. |
| 7,317,201 B2 | 1/2008 | Gutsche et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,502,252 B2 | 3/2009 | Fuji et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,569,844 B2 | 8/2009 | Lung |
| 7,683,360 B2 | 3/2010 | Chen et al. |
| 2002/0017701 A1 | 2/2002 | Klersy et al. |
| 2002/0070457 A1 | 6/2002 | Sun et al. |
| 2002/0113273 A1 | 8/2002 | Hwang et al. |
| 2002/0168852 A1 | 11/2002 | Harshfield et al. |
| 2003/0072195 A1 | 4/2003 | Mikolajick |
| 2003/0095426 A1 | 5/2003 | Hush et al. |
| 2003/0116794 A1 | 6/2003 | Lowrey |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0018156 A1 | 1/2006 | Happ |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0169968 A1 | 8/2006 | Happ |
| 2006/0172067 A1 | 8/2006 | Ovshinsky et al. |
| 2006/0175599 A1 | 8/2006 | Happ |
| 2006/0192193 A1 | 8/2006 | Lee et al. |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1* | 12/2006 | Dodge .................. 257/2 |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |

| | | |
|---|---|---|
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0106923 A1 | 5/2008 | Lung |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0173858 A1* | 7/2008 | An et al. ............ 257/3 |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2008/0303014 A1 | 12/2008 | Goux et al. |
| 2008/0310208 A1 | 12/2008 | Daley |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0166603 A1 | 7/2009 | Lung |
| 2009/0268507 A1 | 10/2009 | Breitwisch et al. |
| 2009/0289242 A1 | 11/2009 | Breitwisch et al. |
| 2009/0294748 A1 | 12/2009 | Breitwisch et al. |
| 2010/0055830 A1 | 3/2010 | Chen et al. |

OTHER PUBLICATIONS

"Magnetic Bit Boost," www.sciencenews.org, Dec. 18 & 25, 2004, p. 389, vol. 166.
"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published at least as early as Dec. 1997, pp. 1-6.
Bedeschi, F. et al., "4-MB MOSFET-Selected Phase-Change Memory Experimental Chip," IEEE, Sep. 21-23, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, An et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.
Gibson, G. A. et al., "Phase-change Recording Medium that Enables Ultrahigh-density Electron-beam Data Storage, " Applied Physics Letter, 2005, 3 pp., vol. 86.
Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.
Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," Jun. 10-12, 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, Apr. 17-21, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Non-volatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates, " Mat. Res. Soc. Symp. Proc., vol. 106, 1998, pp. 21-26.

* cited by examiner

METHODS FOR REDUCING RECRYSTALLIZATION TIME FOR A PHASE CHANGE MATERIAL

CROSS-REFERENCE TO RELATED APPLICATIONS

This application claims the benefit of U.S. Provisional Application No. 61/254,572 titled "Methods for High Speed Recrystallization of Phase Change Memory and Device Employing the Same" filed 23 Oct. 2009, which is incorporated by reference herein.

PARTIES TO A JOINT RESEARCH AGREEMENT

International Business Machines Corporation, a New York corporation, and Macronix International Corporation, Ltd., a Taiwan corporation are parties to a Joint Research Agreement.

BACKGROUND OF THE INVENTION

1. Field of the Invention

The present invention relates to memory devices based on phase change based memory material, including chalcogenide based materials and other materials, and in particular methods for reducing recrystallization (set) time for such devices.

2. Description of Related Art

Phase change based memory materials, like chalcogenide based materials and similar materials, can be caused to change phase between an amorphous and a crystalline state by application of electrical current at levels suitable for implementation in integrated circuits. The generally amorphous state is characterized by higher electrical resistivity than the generally crystalline state, which can be readily sensed to indicate data. These properties have generated interest in using phase change material to form nonvolatile memory circuits, which can be read and written with random access.

The change from the amorphous to the crystalline, referred to as set herein, is generally a lower current operation in which current heats the phase change material above a transition temperature to cause a transition of an active region from the amorphous to the crystalline phase. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the active region to stabilize in the amorphous phase.

Research has progressed to provide memory devices that operate with low reset current by adjusting a doping concentration in phase change material, and by providing structures with very small dimensions. One problem with very small dimension phase change devices involves endurance. Specifically, memory cells made using phase change materials can fail as the composition of the phase change material slowly changes with time because of the instability of the amorphous versus crystalline state. For example, a memory cell in which the active region has been reset to a generally amorphous state may over time develop a distribution of crystalline regions in the active region. If these crystalline regions connect to form a low resistance path through the active region, when the memory cell is read a lower resistance state will be detected and result in a data error. See, Gleixner, "Phase Change Memory Reliability", tutorial. 22nd NVSMW, 2007.

The crystallization times (tx) and crystallization temperatures (Tx) of phase change materials are two of the most important properties. They strongly influence data rate, data retention and archival lifetime and thus the usefulness of a phase change material for technological applications such as re-writable optical recording and phase-change random access memory (PCRAM). In optical storage media, the phase change recording layer is generally sandwiched between two insulating layers; a metal layer is also part of the multilayer structure for realizing high cooling rates during writing. Therefore, a basic storage media is typically comprised of a four-layer stack (IPIM stack, insulator—phase change material—insulator—metal). Different attempts to reduce the crystallization time (which limits the data rate) for a typical phase-change material Ge—Sb—Te have been reported. They include the modification of Ge—Sb—Te by nitrogen/oxygen doping, film thickness optimization (suggesting an optimum thickness of 30 nm for shortest erasure times), and inserting a crystallization-promoting interface layer between one insulator layer and the recording layer. Materials that have been studied as an interface layer to modify the crystallization speed for phase-change recording media include SiC, Si3N4, GeN, Ta2O5, SiO2 and HfO2. (See: [1] G. F. Zhou, Mater. Sci. Engin. A304-306, 73 (2001). [2] G. F. Zhou, B. A. J. Jacobs, and W. V. Es-Spiekman, Mater. Sci. Engin. A226-228, 1069 (1997). [3] G. F. Zhou, and B. A. J. Jacobs, Jpn. J. Appl. Phys. 38, 1625 (1999). [4] N. Ohshima, J. Appl. Phys. 79(11), 8357 (1996). [5] T. Nakai, T. Tsukamoto, S. Ashida, K. Yusu, N. Yoshida, K. Umezawa, N. Ohmachi, N. Morishita, N. Nakamura and K. Ichihara, Jpn. J. Appl. Phys. 43(7B), 4987 (2004).)

SUMMARY OF THE INVENTION

A method for reducing recrystallization time for a phase change material of a memory cell element in conjunction with the manufacture of a memory cell device can be carried out as follows. A phase change material, a buffer layer material and a cladding layer material are selected. The buffer layer material is deposited on the substrate to a buffer layer material thickness. The phase change material is deposited on the buffer layer to a phase change material thickness, in some examples preferably less than 30 nm, and more preferably less than 10 nm. The cladding layer material is deposited on the phase change material to a cladding layer material thickness to form a memory cell element. The recrystallization time of the phase change material of the memory cell element is determined. If the recrystallization time is not less than a length of time X, these steps are repeated while changing at least one of the selected materials and material thicknesses.

Other aspects and advantages of the present invention can be seen on review of the drawings, the detailed description, and the claims which follow.

DETAILED DESCRIPTION

Figure 1:
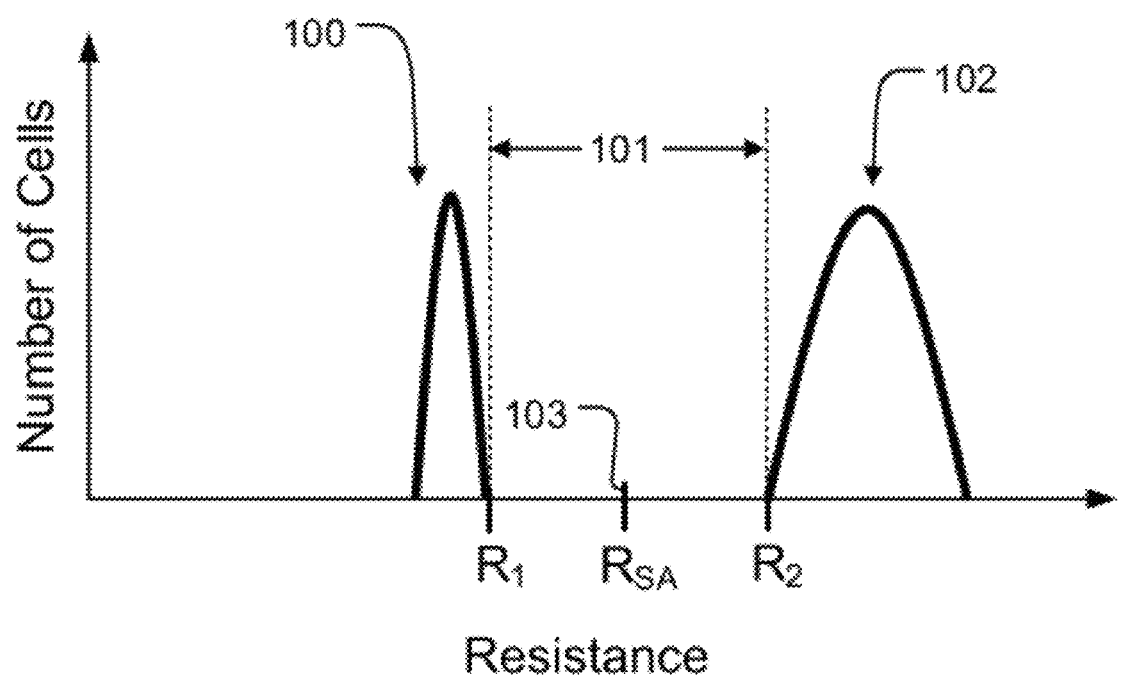
FIG. 1 is an example distribution of the resistance of a number of memory cells each comprising a phase change memory element programmable to a high resistance state and a low resistance state.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

In phase change memory, data is stored by causing transitions in an active region of the phase change material between amorphous and crystalline phases. FIG. 1 is an example distribution of the resistance for a number of memory cells each comprising a phase change memory element. The phase change memory elements of the memory cells are programmable to a plurality of resistance states including a high resistance reset (erased) state 102 and at least one lower resistance set (programmed) state 100. Each resistance state corresponds to a non-overlapping resistance range.

The change from the high resistance state 102 to the lower resistance state 100, referred to as set (or program) herein, is generally a lower current operation in which current heats the phase change material above a transition temperature to cause transition from the amorphous to the crystalline phase. The change from lower resistance state 100 to the high resistance state 102, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous phase.

The difference between the highest resistance $R_1$ of the lower resistance state 100 and the lowest resistance $R_2$ of the high resistance reset state 102 defines a read margin 101 used to distinguish cells in the lower resistance state 100 from those in the high resistance state 102. The data stored in a memory cell can be determined by determining whether the memory cell has a resistance corresponding to the lower resistance state 100 or to the high resistance state 102, for example by measuring whether the resistance of the memory cell is above or below a threshold resistance value $R_{SA}$ 103 within the read margin 101.

FIGS. 2A-2D show representative prior art memory cell structures for which the methods for reducing recrystallization time described herein can be applied.

Figure 2A:
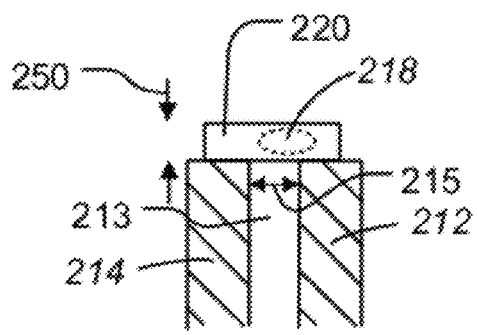
FIGS. 2A-2D show representative prior art memory cell structures.

FIG. 2A is a simplified cross-sectional view of a "bridge-type" memory cell 200 illustrating a first configuration for memory element 220 coupled to first and second electrodes 212, 214. The first electrode 212 may, for example, be coupled to a terminal of an access device such as a transistor, while the second electrode 214 may be coupled to a bit line.

A dielectric spacer 213 having a width 215 separates the first and second electrodes 212, 214. The phase change material of memory element 220 has a thickness 250 and extends across the dielectric spacer 213 to contacts the first and second electrodes 212, 214, thereby defining an inter-electrode path between the first and second electrodes 212, 214 having a path length defined by the width 215 of the dielectric spacer 213. In operation, as current passes between the first and second electrodes 212, 214 and through the memory element 220, the active region 218 of the phase change material of the memory element 220 heats up more quickly than the remainder of the memory element 220.

Figure 2B:
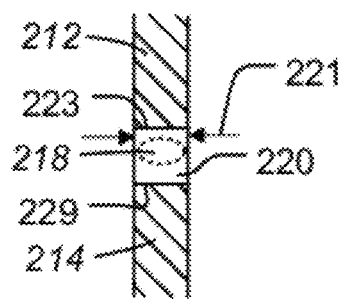

FIG. 2B is a simplified cross-sectional view of a "pillar-type" memory cell illustrating a second configuration having a pillar shaped memory element 220 surrounded by a dielectric and coupled to first and second electrodes 212, 214. The phase change material of the memory element 220 has an active region 218 and contacts the first and second electrodes 212, 214 at top and bottom surfaces 223, 229 respectively. The memory element 220 has a width (which in some embodiments is a diameter) 221 the same as that of the first and second electrodes 212, 214.

Figure 2C:
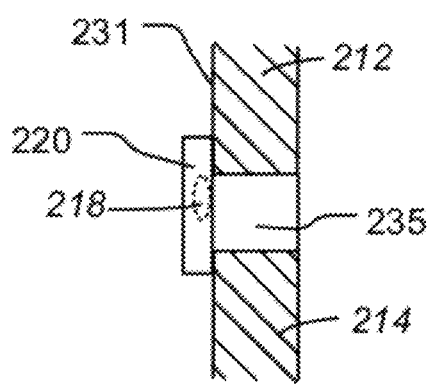

FIG. 2C is a simplified cross-sectional view of a "sidewall-type" memory cell illustrating a third configuration for memory element 220 coupled to first and second electrodes 212, 214, the phase change material of memory element 220 having an active region 218. The first and second electrodes 212, 214 are separated by dielectric spacer 235. The first and second electrodes 212, 214 and the dielectric spacer 235 have a sidewall surface 231. The phase change material of memory element 220 is on the sidewall surface 231 and extends across the dielectric spacer 235 to contact the first and second electrodes 212, 214.

Figure 2D:
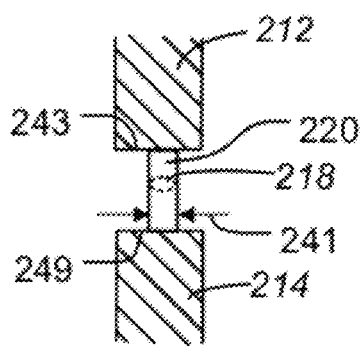

FIG. 2D is a simplified cross-sectional view of a "pore-type" memory cell illustrating a fourth configuration for memory element 220 surrounded by a dielectric and coupled to first and second electrodes 212, 214. The phase change material of memory element 220 has an active region 218 and contacts the first and second electrodes 212, 214 at top and bottom surfaces 243, 249 respectively. The memory element 220 has a width (which in some embodiments is a diameter) 241 less than that of the first and second electrodes 212, 214.

Reading or writing to the memory cell 200 can be achieved by applying appropriate bias arrangements across the memory element 220. The bias arrangements comprise applying pulses to one or both of the first and second electrodes 212, 214 to induce current through the memory element 220. The levels and durations of the pulses applied are dependent upon the operation performed (e.g. a read operation or a programming operation) and can be determined empirically for each embodiment. The bias arrangements may include pulses having a positive voltage from the second electrode 214 to the first electrode 212 (referred to herein as a positive voltage across the memory element 220), and/or may include pulses having a negative voltage from the second electrode 214 to the first electrode 212 (referred to herein as a negative voltage across the memory element 220).

In a read (or sense) operation of the memory cell 200, bias circuitry coupled to the first and second electrodes 212, 214 applies a read bias arrangement across the memory element 220 of suitable amplitude and duration to induce current to flow which does not result in the memory element 220 undergoing a change in resistive state. The current through the memory element 220 is dependent upon the resistance of the memory element 220. Thus, the current through the memory element 220 indicates the data value stored in the memory cell 200.

In a reset (or erase) operation of the memory cell 200, bias circuitry coupled to the first and second electrodes 212, 214 applies a reset bias arrangement of suitable amplitude and duration to induce a current to flow through the memory element 220, thereby raising the temperature of at least the active region above the transition (crystallization) temperature of the phase change material of the memory element 220 and also above the melting temperature to place at least the active region 218 in a liquid state. The current is then terminated, for example by terminating voltage pulses applied to the first and second electrodes 212, 214, resulting in a relatively quick quenching time as the active region 218 rapidly cools to stabilize to an amorphous phase.

In a set (or erase) operation of the memory cell 200, bias circuitry coupled to the first and second electrodes 212, 214 applies a set bias arrangement of suitable amplitude and duration to induce a current to flow through the memory element 220, thereby raising the temperature of at least a portion of the active region 218 above the transition temperature and cause a transition of at least a portion of the active region 218 from the amorphous phase to the crystalline phase, this transition lowering the resistance of the memory element 220 and setting the memory cell 200 to the desired state.

Figure 3:
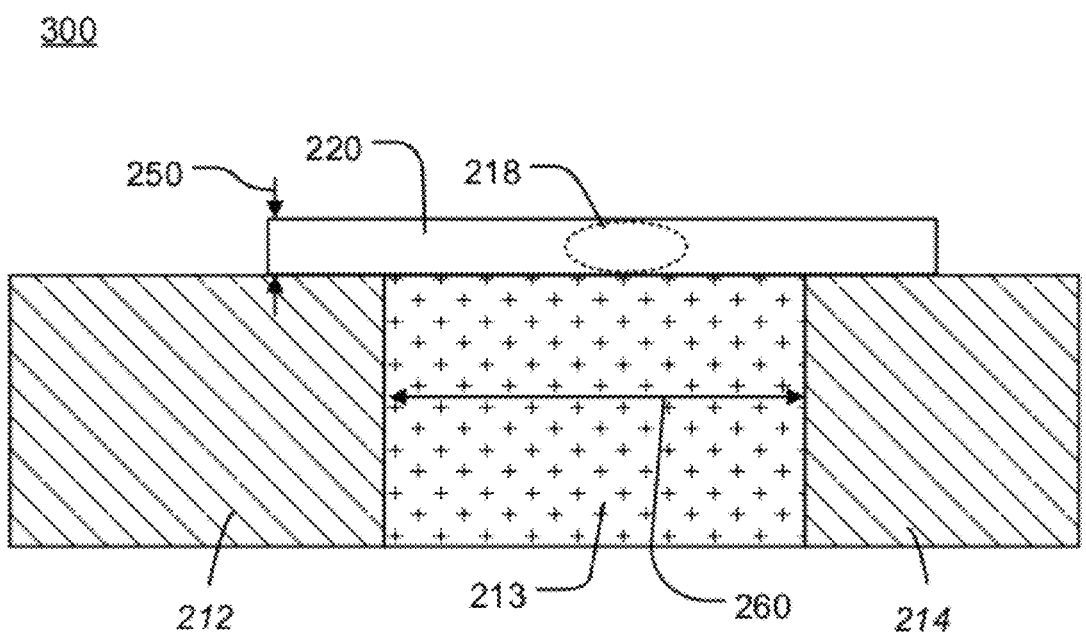
FIG. 3 is cross-sectional view of a bridge type memory cell.

Illustrated in FIG. 3 is a bridge type memory cell 300 having first and second electrodes 212, 214 and a phase change memory element 220 extending across a dielectric spacer 213 to contact the electrodes 212, 214. The phase change memory element 220 defines an inter-electrode path between the first and second electrodes having an inter-electrode path length defined by the width 260 of the dielectric spacer 213. During a set operation, heating takes place within the amorphous active region 218 since the resistance in the amorphous phase is higher than that in the crystalline phase.

Figure 4:
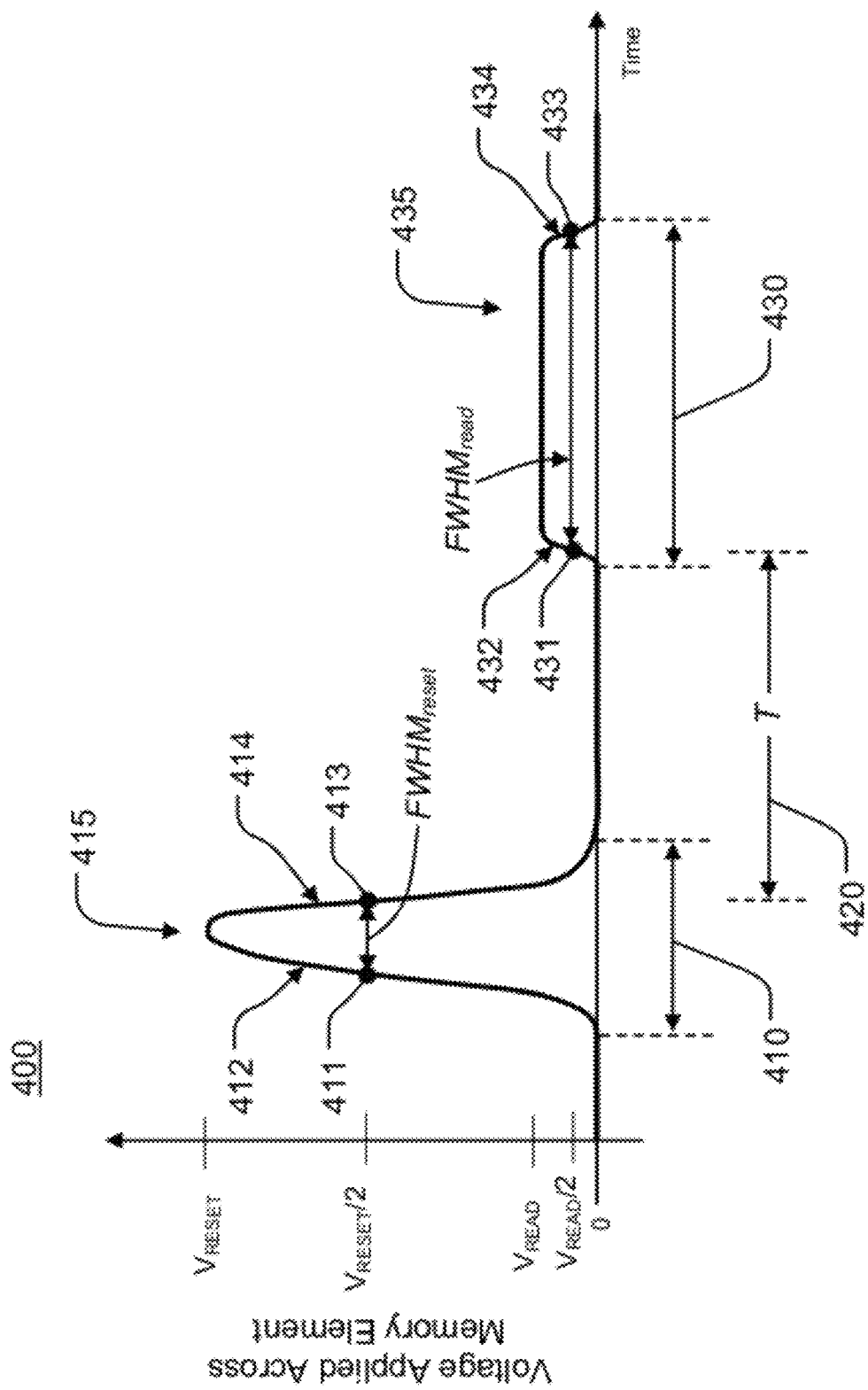
FIGS. 4 and 5 illustrate timing diagrams for a read after reset operation and a read after set operation respectively.
Figure 5:
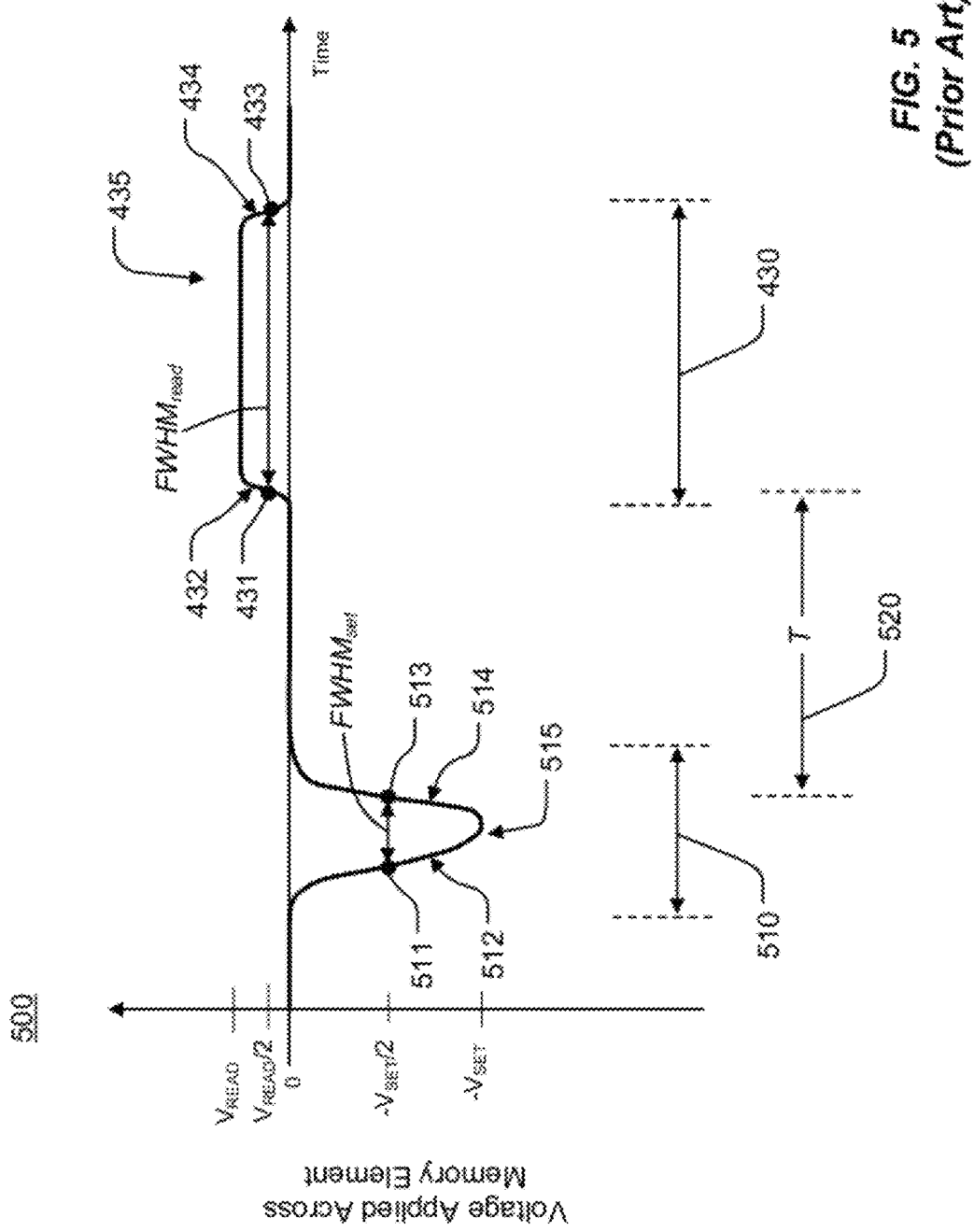

FIGS. 4 and 5 illustrate timing diagrams for a read after reset operation 400 and a read after set operation 500 respectively of the memory cell 200. The timing diagrams of FIGS. 4 and 5 are simplified and not necessarily to scale. FIG. 4 illustrate generally conventional timing diagrams for a read after reset operation, but in FIG. 5 a set pulse with a negative voltage polarity, called a bipolar operation, is illustrated.

The operation 400 of FIG. 4 includes a reset operation 410 for programming the memory element 220 from the lower resistance state 100 to the higher resistance state 102, a read operation 430, and a time interval 420 between the programming pulse 415 and the read pulse 435.

The reset operation 400 comprises a reset pulse 415 having a first voltage polarity across the memory element 220 applied to the memory cell 200. The reset pulse 415 can be applied by changing the voltage applied to one electrode or changing the voltage applied to both of the first and second electrodes 212, 214.

The reset pulse 415 has a pulse height $V_{RESET}$ and leading and trailing edges 412, 414. The leading edge 412 has a full-width at half-maximum (FWHM) point 411 where the leading edge 412 has a voltage of $V_{RESET}/2$. The trailing edge 414 has a FWHM point 413 where the trailing edge 414 has a voltage of $V_{RESET}/2$. The FWHM points 411, 413 define a full-width at half-maximum pulse width $FWHM_{RESET}$. As used herein, the term "pulse width" refers to full-width at half-maximum pulse width.

The reset pulse 415 induces current to flow from the second electrode 214 to the first electrode 212. The current is sufficient to raise the temperature of at least the active region 218 above the transition temperature and also above the melting temperature to place at least the active region 218 in a liquid state. The current is then terminated by the falling edge 414 of the reset pulse 415, allowing the active region 218 to rapidly cool and stabilize to an amorphous phase.

The read operation 430 comprises a read pulse 435 having a pulse height $V_{READ}$ and leading and trailing edges 432, 434. The leading edge 432 has a full-width at half-maximum (FWHM) point 431 where the leading edge 432 has a voltage magnitude of $V_{READ}/2$. The trailing edge 434 has a FWHM point where the trailing edge 434 has a voltage magnitude of $V_{READ}/2$. The FWHM points 431, 433 define a full-width at half-maximum pulse width $FWHM_{READ}$.

The time interval 420 between FWHM point 413 and FWHM point 431 is sufficient for the resistance of the phase change memory element 220 to reach a resistance corresponding to the reset state 102, so that resistance state of the memory element 220 can be properly determined by the read operation 430.

The read pulse 435 induces current to flow from the second electrode 214 to the first electrode 212. The current is insufficient to cause a change in the resistance state of the memory element 220, and is dependent upon the resistance of the memory element 220. Thus, the current through the memory element 220 indicates the data value stored in the memory cell 200.

The pulse widths, pulse heights, rise and fall times of the reset and read operations 410, 430, and the time interval 420, can be determined empirically for each embodiment. In some embodiments the pulse width $FWHM_{READ}$ of the read pulse 435 can be between about 10 ns and 30 ns, for example being about 20 ns.

Referring to FIG. 5, the operation 500 includes a set operation 510 for programming the memory element 220 from the higher resistance state 102 to the lower resistance state 100, followed after a time interval $T_{OFF}$ 520 with a read operation 430. The set operation 510 comprises a set pulse 515 having a voltage polarity across the memory element 220 opposite that of the reset pulse 415 of the reset operation 410.

The set pulse 515 has a pulse height $V_{SET}$ and leading and trailing edges 512, 514. The leading edge 512 has a full-width at half-maximum (FWHM) point 511 where the leading edge 512 has a voltage of $V_{SET}/2$. The trailing edge 514 has a FWHM point 513 where the trailing edge 514 has a voltage of $V_{SET}/2$. The FWHM points 511, 513 define a full-width at half-maximum pulse width $FWHM_{SET}$.

The set pulse 515 induces current to flow from the first electrode 212 to the second electrode 214. Thus, the set operation 510 induces current to flow through the memory element 220 in a direction opposite that of the reset operation 415.

The current induced by the set pulse 515 is sufficient to raise the temperature of the active region 218 above the transition temperature (crystallization) temperature to cause a transition of the active region 218 into a crystalline phase.

The pulse widths, pulse heights, rise and fall times of the set operation 510, and the time interval 520, can be determined empirically for each embodiment.

In FIGS. 4 and 5 the read pulse 435 has a positive voltage polarity from the second electrode 214 to the first electrode 212. Alternatively, the read pulse 435 can have a negative voltage polarity.

In FIGS. 4 and 5, the reset pulse 415 has a positive voltage polarity from the second electrode 214 to the first electrode 212, and the set pulse 515 has a negative voltage polarity from the second electrode 214 to the first electrode 212. The reset pulse 415 can also have a negative voltage polarity from the second electrode 214 to the first electrode 212 and the set pulse 515 has a positive voltage polarity from the second electrode 214 to the first electrode 212.

Figure 6:
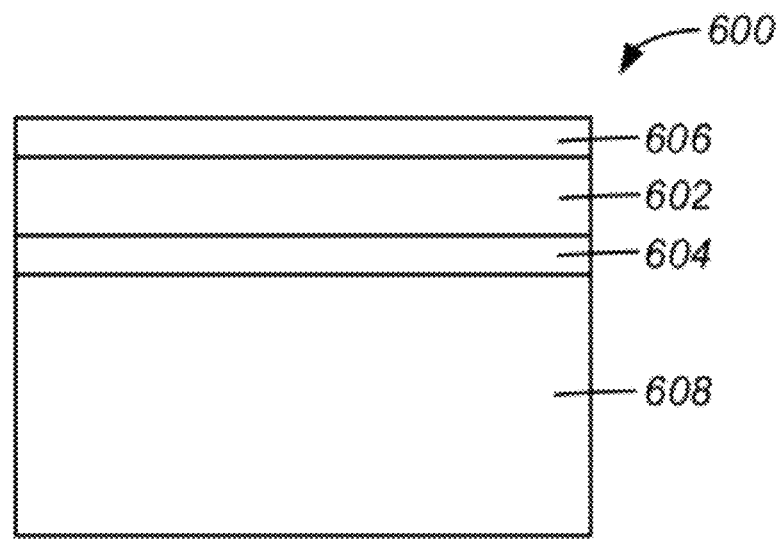
FIG. 6 is a simplified cross-sectional view showing a memory cell element made according to the invention.

The present invention is based upon the recognition that the recrystallization time for a phase change material can be effectively improved for a memory cell element 600, see FIG. 6, comprising a particular phase change material 602, such as GST or GeSb, by (1) the selection of an appropriate buffer layer material 604 and an appropriate cladding layer material 606 for use on either side of the phase change material, the buffer layer material being between the phase change material 602 and a substrate 608, and (2) reducing the thickness of the phase change material. The cladding layer material 606 is sometimes referred to as the capping layer material. While the buffer layer and cladding layer materials are typically the same material, they can be different materials. In some examples there is an additional advantage in that the transition temperature Tx is also substantially increased, such as by 100° C. This is important because an increase in Tx provides for increased long-term stability in the amorphous state.

One example of a method for reducing recrystallization time for a phase change material of a memory cell element of a memory cell device proceeds generally as follows. A particular phase change material 602, such as the GST, typically $Ge_2Sb_2Te_5$, or GeSb, suitable for the particular memory cell device is chosen. An electrically conductive buffer layer material 604, for use between phase change material 602 and substrate 608, is chosen. Buffer layer 604 acts as a thermal barrier layer to aid the efficient heating of phase change material 602. Examples of suitable buffer layer materials include $Al_2O_3$, TiN, $SiO_2$ and SiN. An electrically conductive cladding layer material 606 is selected for use over phase change material 602. Cladding layer material 606 may be the same as or different from buffer layer material 604. Examples of cladding layer materials include $GeO_x$, $Al_2O_3$, TiN, $SiO_2$ and Al.

Figure 12:
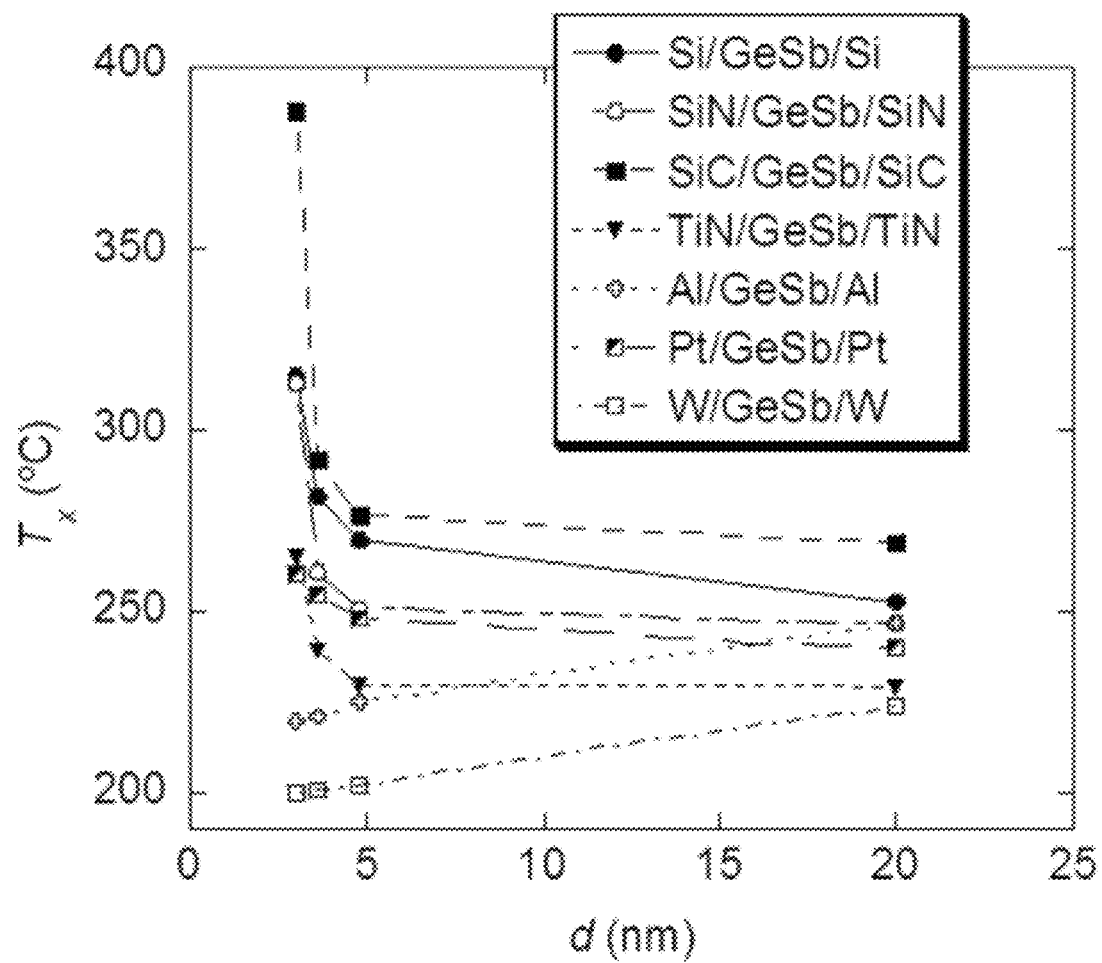
FIG. 12 is a plot of crystallization temperature $T_x$ versus the thickness of the cladding layer for various cladding materials with GeSb as the phase change material.

Due to the laser testing setup, only $Al_2O_3$ was used as a buffer layer 604 to measure the recrystallization time for all cases. However, for crystallization temperatures as a function of thickness as shown in FIG. 12, it is believed that the same materials or different materials can be used for buffer layer 604 and capping layer 606.

The selected buffer layer material 604 is deposited on the substrate 608 to a buffer layer material thickness, typically between about 10 and 30 nm. The thickness of buffer layer 604 is typically varied with the thickness of phase-change material 602, with thicker phase change material indicating thicker buffer layer material. In some examples buffer layer material 604 is deposited directly on substrate 608 while in the other examples one or more intermediate layers may be used between layers 604, 608.

Figure 6A:
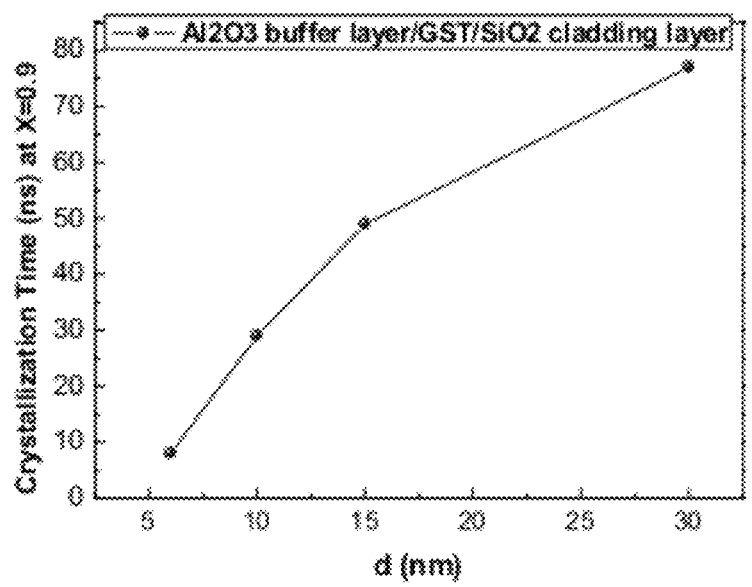
FIG. 6A illustrates faster crystallization speeds with thinner phase change material layers.

The selected phase change material 602 is deposited on the buffer layer to a phase change material thickness of less than 30 nm. As discussed below, in experiments it has been found that limiting the phase change material thickness to no more than about 10 nm provides a significant decrease in recrystallization time for the phase change material using appropriate cladding materials. Although applicants only have the data for $Al_2O_3$ as a buffer layer, it is believed that the use of other buffer materials could make small changes in the recrystallization speed, use of different buffer materials will not materially affect the speed trend as a function of GST thickness. The basic speed trend, see FIG. 6A, is faster crystallization speeds with thinner phase change material layers 602. This can be contrasted with the opposite speed trend found with conventional basic storage media structures (IPIM stack, that is insulator—phase change material—insulator—metal); for such structures the recrystallization speed increase with increasing GST thickness from 15 nm~35 nm.

The selected cladding layer material 606 is deposited on the phase change material 602 to a cladding layer material thickness to form the memory cell element 600. The thickness of cladding layer material 606 is preferably relatively thin, typically about 5 to 10 nm thick.

The recrystallization time of phase change material 602 of memory cell element 600 is determined for the particular materials and thicknesses used. If more information is desired, especially if the recrystallization time is not sufficiently short, such as less than 40 ns, a new example is made and tested by repeating at least one of the above steps while changing at least one of the selected materials and/or material thicknesses. After doing so, the recrystallization time of the phase change material 602 of the newly created new memory cell element 600 is determined. The testing and creation of new example of memory cell element 600 may be repeated as desired.

In some situations it may be desired to continue testing new materials and/or thicknesses even though one of the examples of memory cell element 600 demonstrates a suitably short recrystallization time. For example, it may be one example has an acceptable recrystallization time but the measured recrystallization temperature, or some other characteristic, may not be within a desired range. Also, it may be desired to run additional tests using one or more different phase change materials.

An important aspect of the invention in the recognition that by sandwiching phase change material 602 between appropriate buffer and cladding layers 604, 606, faster recrystallization times can be achieved when the phase change material is thin, preferably less than 30 nm, and more preferably less than 10 nm, such as 7 nm. This recognition provides the basis for designing a reasonable testing methodology with the goal of finding memory cell elements having a reasonably fast recrystallization time, sometimes coupled with an elevated crystallization temperature. An example of testing methodology may start with a chosen phase change material and the same material for the cladding and buffer layers; examples are then made and tested while varying the thickness of the phase change material layer 602, and to a lesser extent the thicknesses of the cladding serial layer 606 and buffer material layer 604. The next phase of testing may use the same phase change material but a new material for the cladding layer or the cladding and buffer layers; examples are then made and tested with a thicknesses varied. Other methodology may also be used.

In summary, a method for reducing recrystallization time for a phase change material 602 of a memory cell element 600 in conjunction with the manufacture of a memory cell device can be carried out as follows. The phase change material 602, typically GST, the buffer layer material 604, such as Al2O3, and the cladding layer material 606 are selected. Typical cladding layer materials 606 include GeOx, Al2O3, TiN, SiO2 and Al. The buffer layer material 604 is deposited on substrate 608 to a buffer layer material thickness, typically about 10-30 nm. The phase change material 602 is deposited on the buffer layer 604 to a phase change material thickness, preferably less than 30 nm, and more preferably less than 10 nm. The cladding layer material 606 is deposited on the phase change material 602 to a cladding layer material thickness, typically about 5 to 10 nm, to form a memory cell element. The recrystallization time of the phase change material 602 of the memory cell element 600 is determined. If the recrystallization time is not less than a length of time X, such as 10 to 40 ns, these steps are repeated while changing at least one of the selected materials and material thicknesses. One typical way for proceeding would be to continue using the same materials but change the thickness of the phase change material first and then the thickness of the cladding layer material. Similar sets of tests can then be conducted for different phase change materials 602 and for different cladding materials 606.

Experimental

A sample memory cell element 600 was exposed to laser pulses of variable pulse powers and pulse widths using a wavelength of 658 nm, and the reflectivity of the same spot was constantly monitored using a low power continuous wave (CW) laser with a wavelength of 635 nm.

Three kinds of laser experiments were performed: single pulse experiments, post-pulse experiments and pre-pulse experiments. The single pulse experiment measured the crystallization time of as-deposited, amorphous films by exposing the sample to pulses of variable power and duration, and an increase in reflectivity indicated successful crystallization. From the single-pulse experiments the pulse conditions for reliable crystallization were determined. The post-pulse and pre-pulse experiments were performed on crystalline (rock-salt-phase) samples which were obtained by annealing them at 250° C. for 10 minutes in a nitrogen atmosphere. The post-pulse experiment consisted of variable pulses attempting to melt-quench the material, followed by a constant post-pulse selected from the single pulse experiment known for reliable crystallization. Under conditions where the reflectivity was unchanged after the first pulse, it was too short/weak to melt-quench. When the reflectivity was reduced after the first pulse and restored to the original value by the post-pulse, melt-quenching and re-crystallization was successful. When the reflectivity was reduced after the first pulse and not restored by the post-pulse, the first pulse was too long/strong and ablation occurred. From this experiment, conditions for reliable melt-quenching were selected. Finally, the pre-pulse experiment used a fixed pre-pulse known for reliable melt-quenching followed by a variable pulse attempting to re-crystallize. Pre-pulse experiments were used to measure re-crystallization times.

Time-resolved x-ray diffraction (XRD) was also used to study the crystallization behavior of these layer stacks. Beamline X20C at the National Synchrotron Light Source has a sample chamber which contains a heater to heat samples in a purified helium atmosphere. The Beamline X20C is equipped with a high-throughput synthetic multilayer monochromator and the X-ray wavelength was 1.797 Å. A fast linear-diode-array detector was used to record the intensity of the diffracted x-ray peaks during heating at a rate of 1° C./s.

Results and Discussion

Figure 7A:
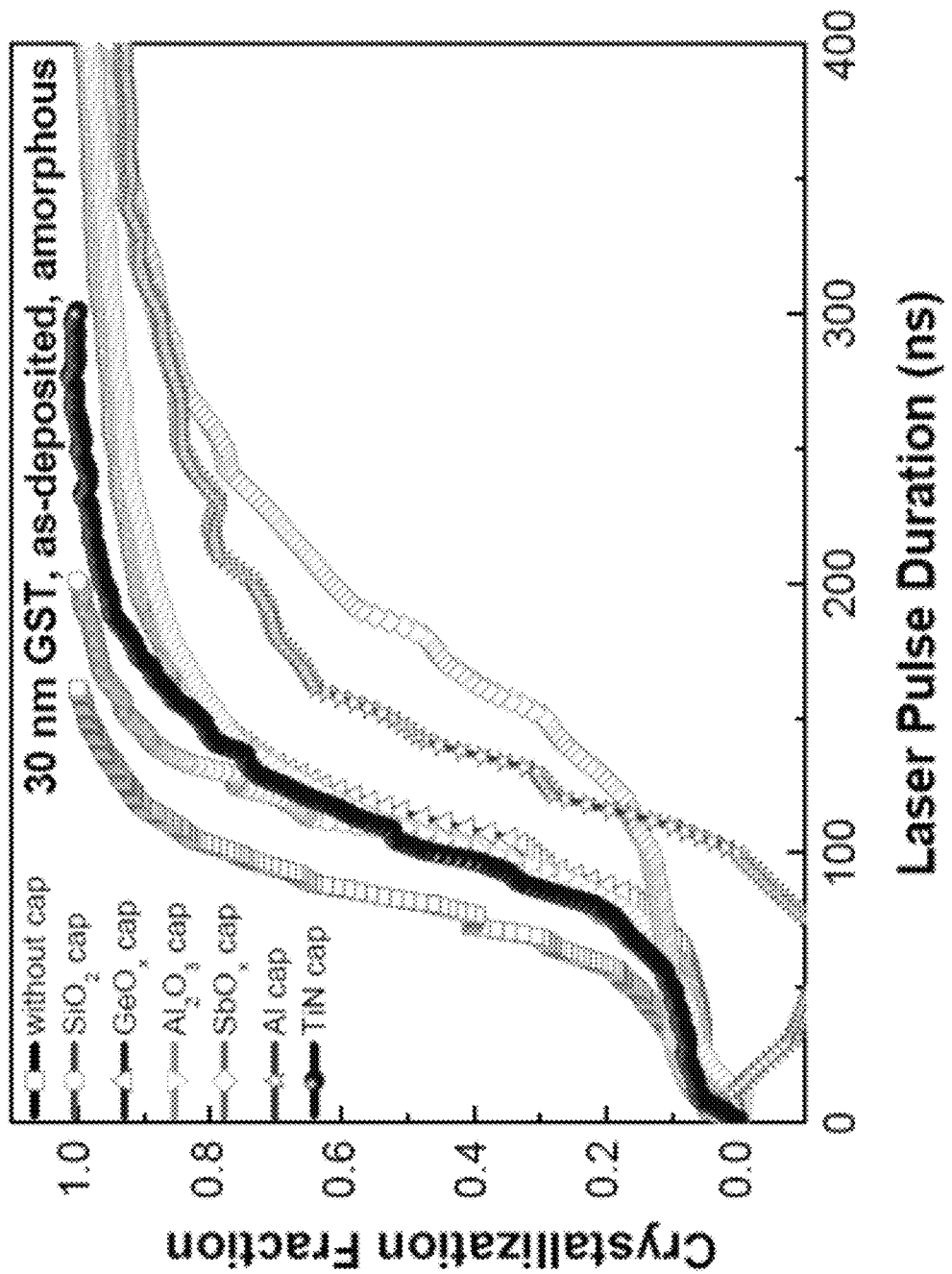
FIGS. 7A and 7B plot the crystallization fraction as a function of laser duration for as deposited, amorphous GST material having 30 nm and 10 nm thicknesses, respectively, with different materials for the cladding layer (cap) of FIG. 6 and with $Al_2O_3$ as a buffer layer.
Figure 7B:
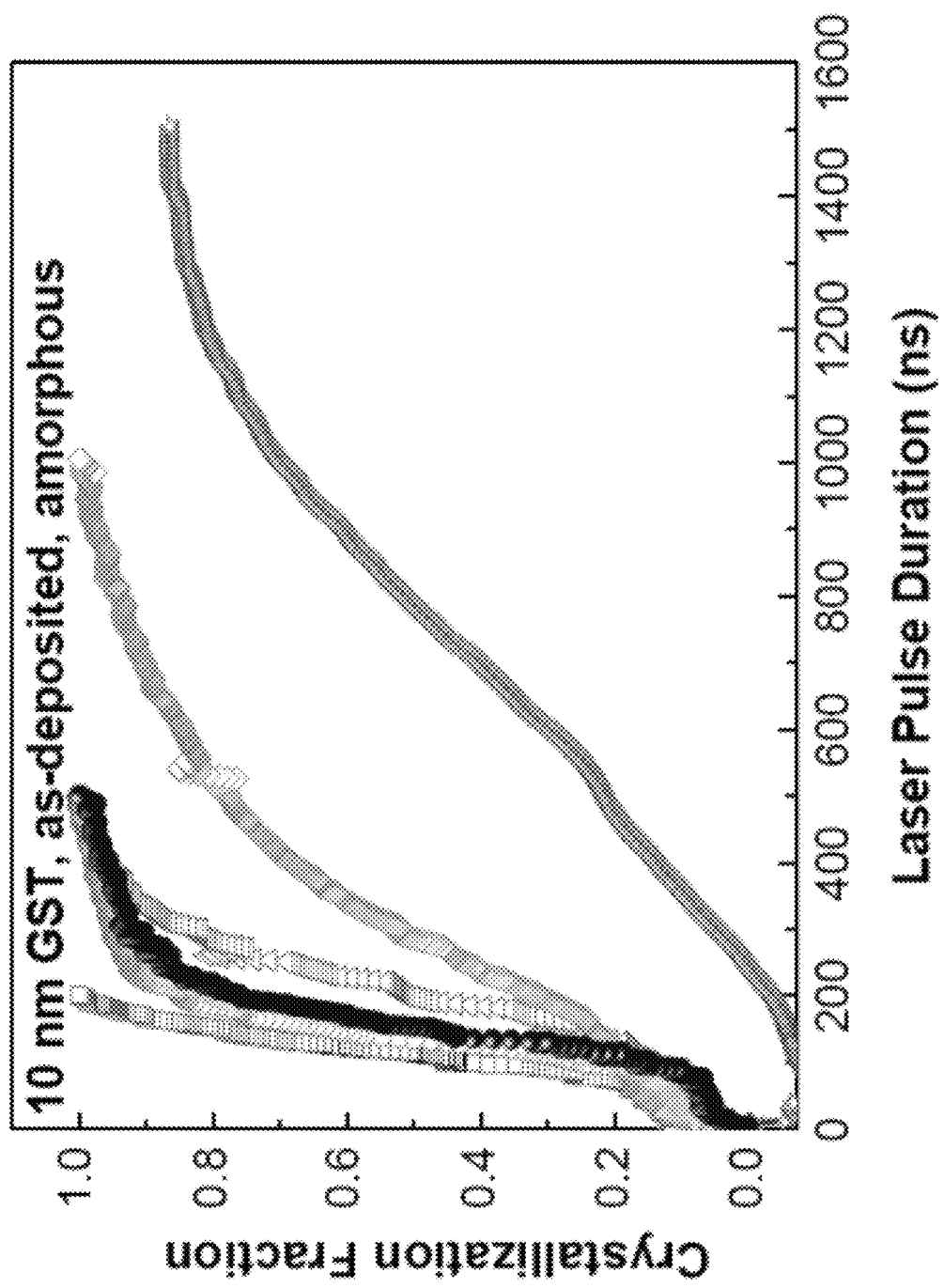

A. Crystallization of as Deposited, Amorphous GST and J-M-A-K Plots as a Function of Capping Layer FIGS. 7A and 7B, respectively summarize the crystallization behavior of 30 nm and 10 nm as-deposited, amorphous GST capped with different capping layers 606. The crystallization fraction was determined by normalizing the relative change in reflectivity to the maximum change in reflectivity for long pulses when it was no longer a function of pulse length. It was found that the as-deposited, amorphous samples with capping layers 606 all showed longer crystallization times for both 30 nm and 10 nm thickness of GST than samples without capping layers.

Figure 8A:
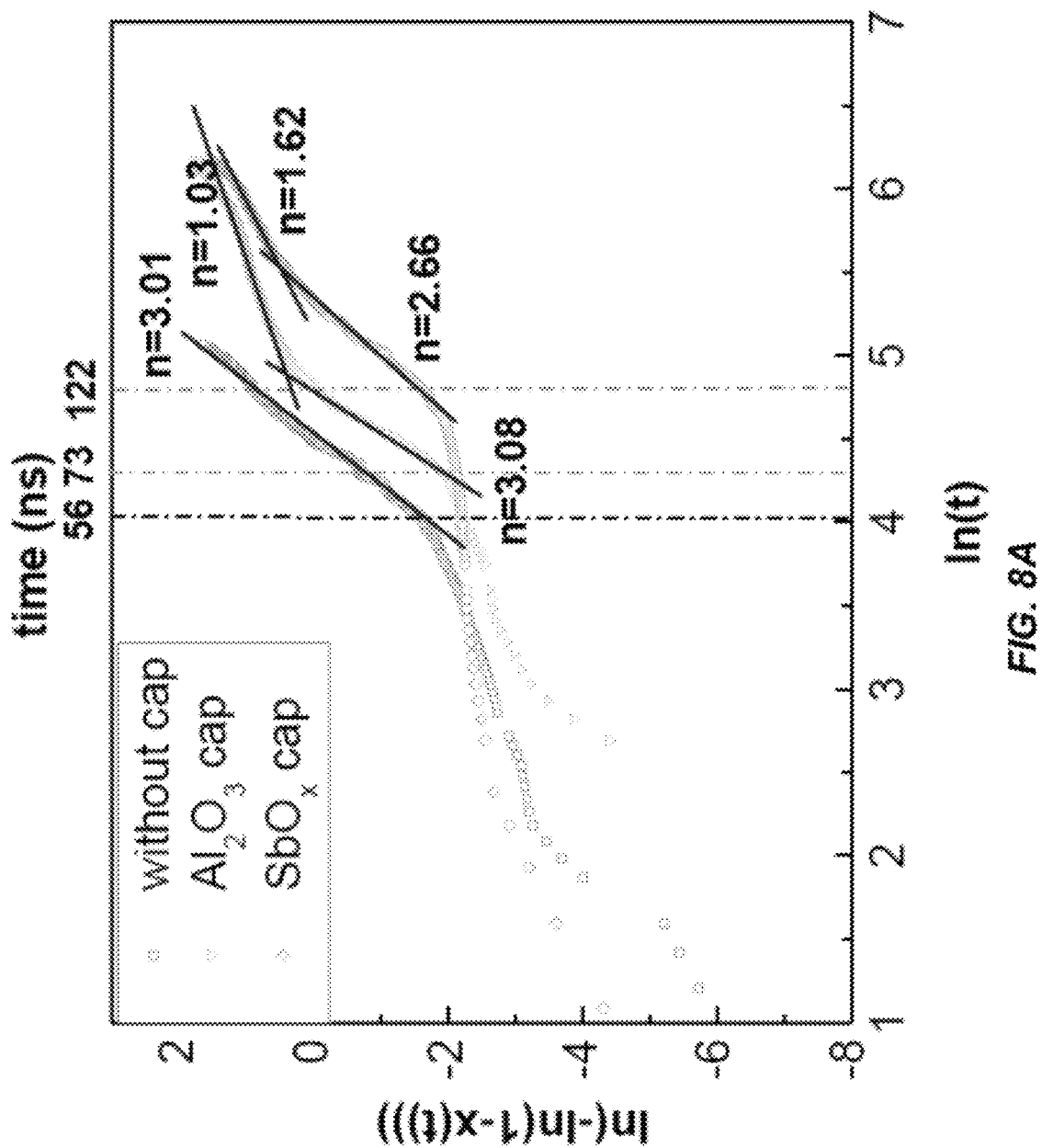
FIGS. 8A and 8B are Johnson-Mehl-Avrami-Kologoromov (JMAK) plots showing the different regimes of crystallization with different slopes for as deposited, amorphous GST material having 30 nm and 10 nm thicknesses, respectively, as a function of different cladding layer (cap) materials.
Figure 8B:
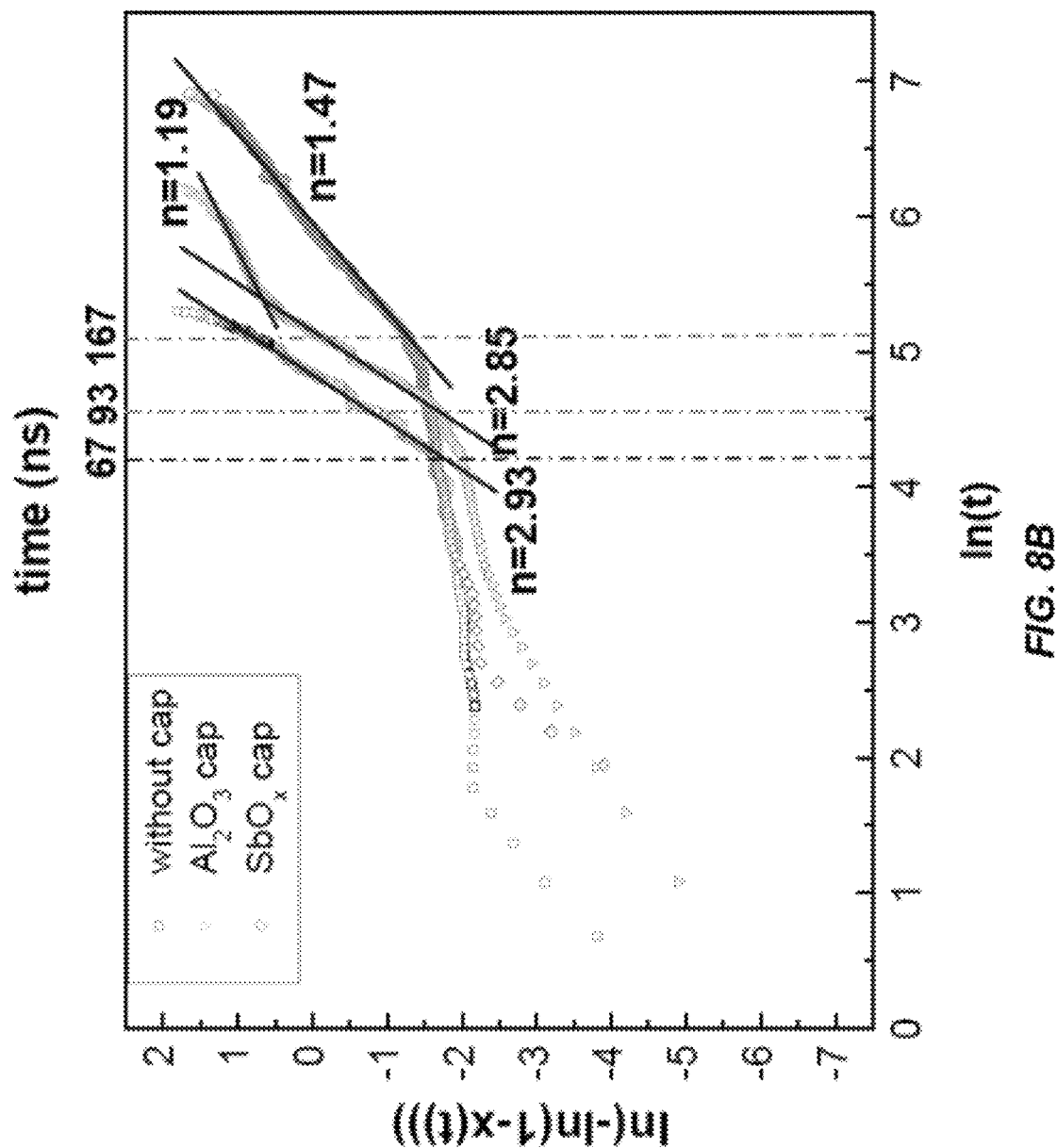

FIGS. 8A and 8B present three different types of Johnson-Mehl-Avrami-Kologoromov (JMAK) plots following the formula $x=1-\exp(-kt^n)$, which describes the transformed volume fraction (x) for crystallization, where k is the rate constant, t is the time, and n is the reaction order for the crystallization of GST films with different interfaces. See S. H. Lee, Y. Hung and R. Agarwal, Nano Lett. 8, 3303 (2008); and X. Wei, L. Shi, T. C. Chong, R. Zhao, and H. K. Lee, Jpn. J. Appl. Phys. 46, 2211 (2007). A linear shape of the plot can be seen after an incubation time of approximately 56, 73 and 122 ns for uncapped GST, $Al_2O_3$ and $SbO_x$ interfaces, respectively indicating that different interfaces cause different incubation times. When the thickness is reduced to 10 nm, the incubation times increase slightly to 67, 93 and 167 ns, respectively. For 30 nm GST with $Al_2O_3$ interfaces, there is a sudden decrease of the slope after the pulse time is increased to 132 ns. The change of slope (n) from 3 to 1, which shows good agreement with literature for a typical nucleation-dominated crystallization observed for GST, implies the stationary nucleation rate with two-dimensional (2D) growth at the early stage and changing to subsequent layer-by-layer 1D growth. Although the comparison of AFM investigation with optical measurements thus reveals the close correlation between the slope of the JMA plot and the growth mode, applicants do not attempt to interpret too much about the growth mechanisms but emphasize instead the significant differences of n values caused by difference interfaces. Different capping materials affect the incubation time greatly; consequently, the crystallization process is dominated by dielectric materials at the interface, especially when the phase change layer thickness is reduced. The currently discussed crystallization times refer to the as-deposited, amorphous films. The technologically relevant crystallization time, however, is the re-crystallization of melt-quenched materials; therefore, which is discussed in the next section.

Figure 9A:
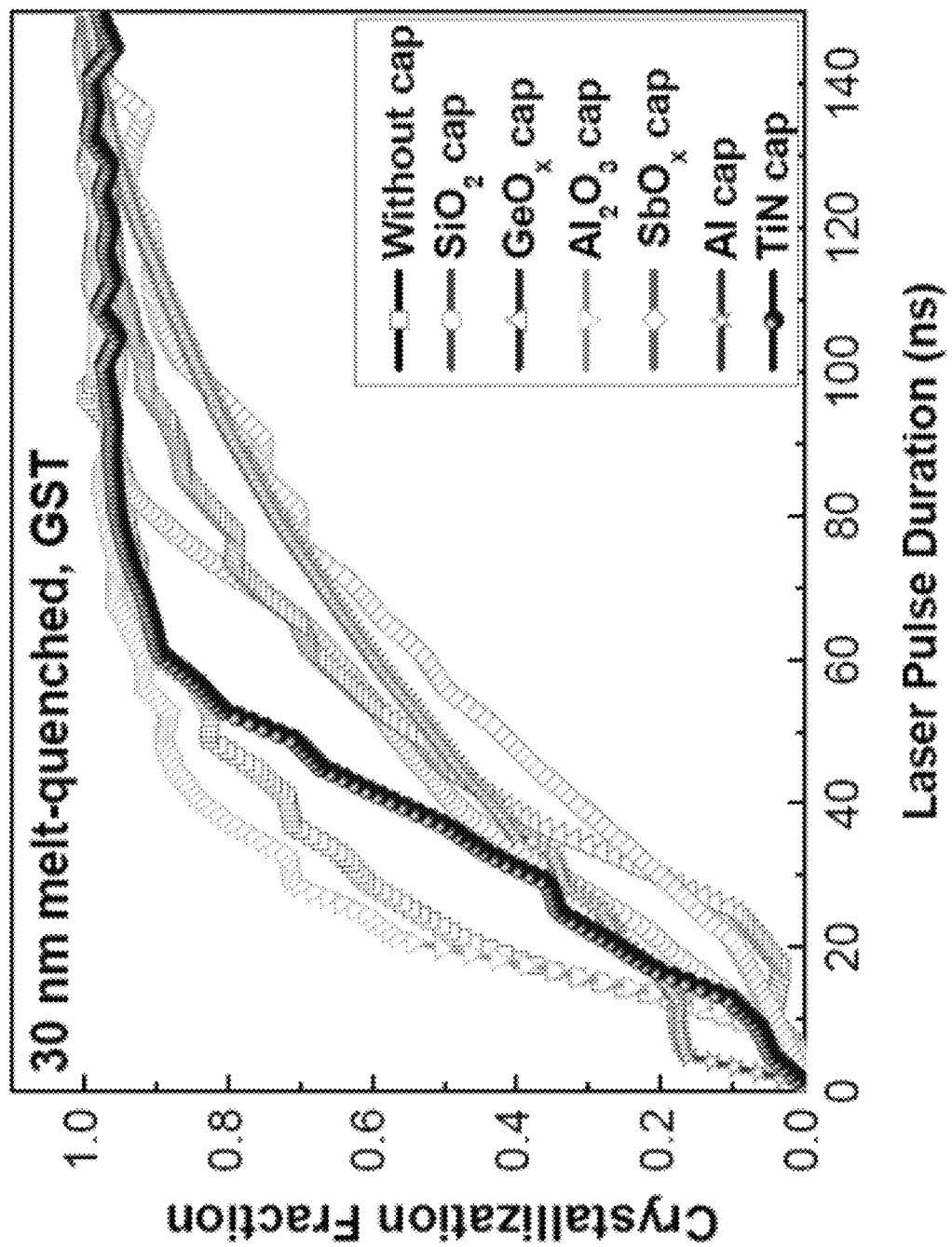
FIGS. 9A and 9B plot crystallization fraction as a function of laser duration for re-crystallization of GST melt-quenched from the rocksalt phase for GST material having 30 nm and 10 nm thicknesses, respectively, with different cladding layer (cap) materials.
Figure 9B:
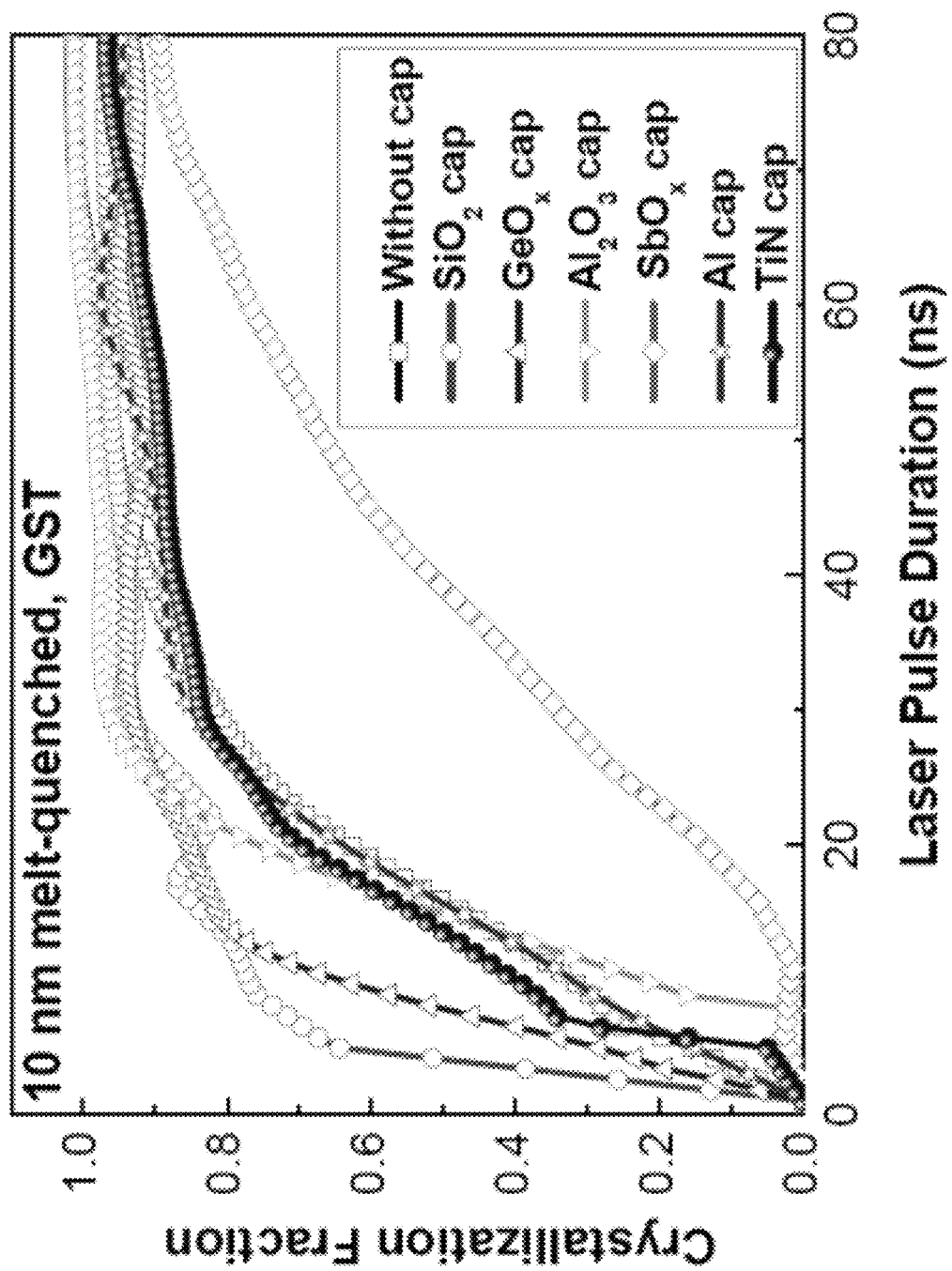

B. Crystallization of Melt-Quenched, Amorphous GST and J-M-A-K Plots as a Function of Capping Layer The crystallization fraction as a function of laser duration for 30 nm and 10 nm melt-quenched, amorphous $Ge_2Sb_2Te_5$, capped with different capping layers are summarized in FIGS. 9 (a) and 9(b), respectively. For 30 nm GST, the $Al_2O_3$ acted as a crystallization promoter leading to the shortest crystallization time of just 50 ns compared to other capping layers or the uncapped GST samples. All other capping materials ($GeO_x$, $SbO_x$, $SiO_2$, Al and TiN) increase the crystallization time, compared to uncapped and $Al_2O_3$ capped GST. However, when the GST film thickness was reduced to 10 nm, the effect of the various capping materials was different. $SiO_2$ and $GeO_x$ capping materials led to the fastest GST re-crystallization compared to uncapped samples and other capping materials. The GST films with TiN, $Al_2O_3$ and Al capping layer exhibited similar crystallization behavior ($Al_2O_3$ showed a slightly faster crystallization than uncapped GST) to uncapped samples. However, the $SbO_x$ capping material acted as a crystallization inhibitor resulting in a re-crystallization time of GST films that was twice as long as the uncapped sample. In all cases, a shorter re-crystallization time was observed for thinner GST films (10 nm) compared to thicker films (30 nm). This is an encouraging result regarding the scalability of PCRAM technology. It has been found previously that 5 nm thick, uncapped GST films have even shorter crystallization times than 10 nm thick films. See H. Y. Cheng, S. Raoux and Y. C. Chen, J. Appl. Phys. [In press.] However, we were not able to measure the re-crystallization time for 5 nm GST as a function of capping materials due to the detection limit of the tester. The data show that the re-crystallization time is a strong function of capping materials as well as the film thickness. The complex dependencies of the crystallization behavior on the film thickness and capping layers indicate different crystallization mechanisms are involved and the importance of the role of the interfaces.

Figure 10A:
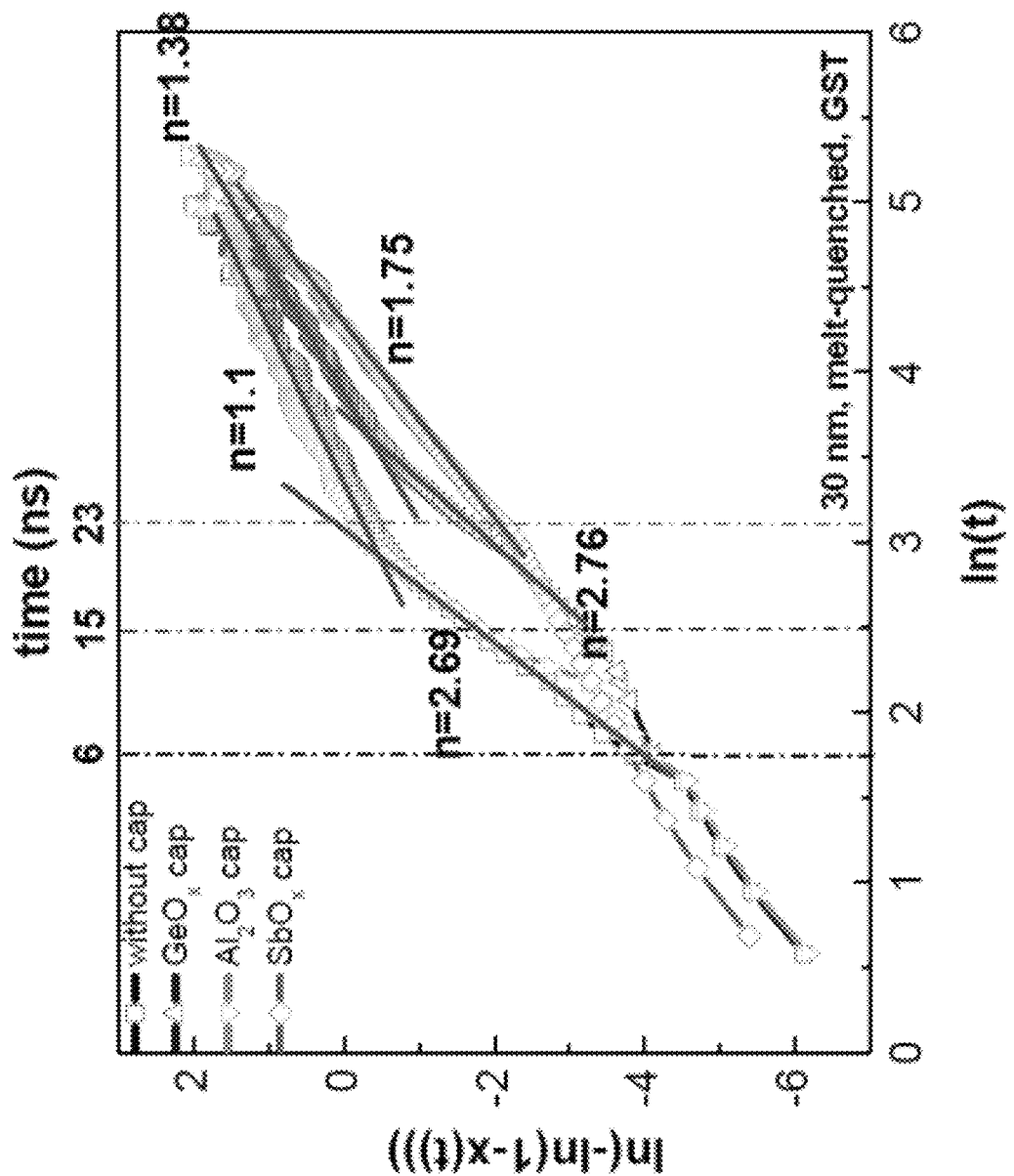
FIGS. 10A and 10B are Johnson-Mehl-Avrami-Kologoromov (JMAK) plots showing the different regimes of re-crystallization with different slopes for GST material having 30 nm and 10 nm thicknesses, respectively, with different cladding layer (cap) materials.
Figure 10B:
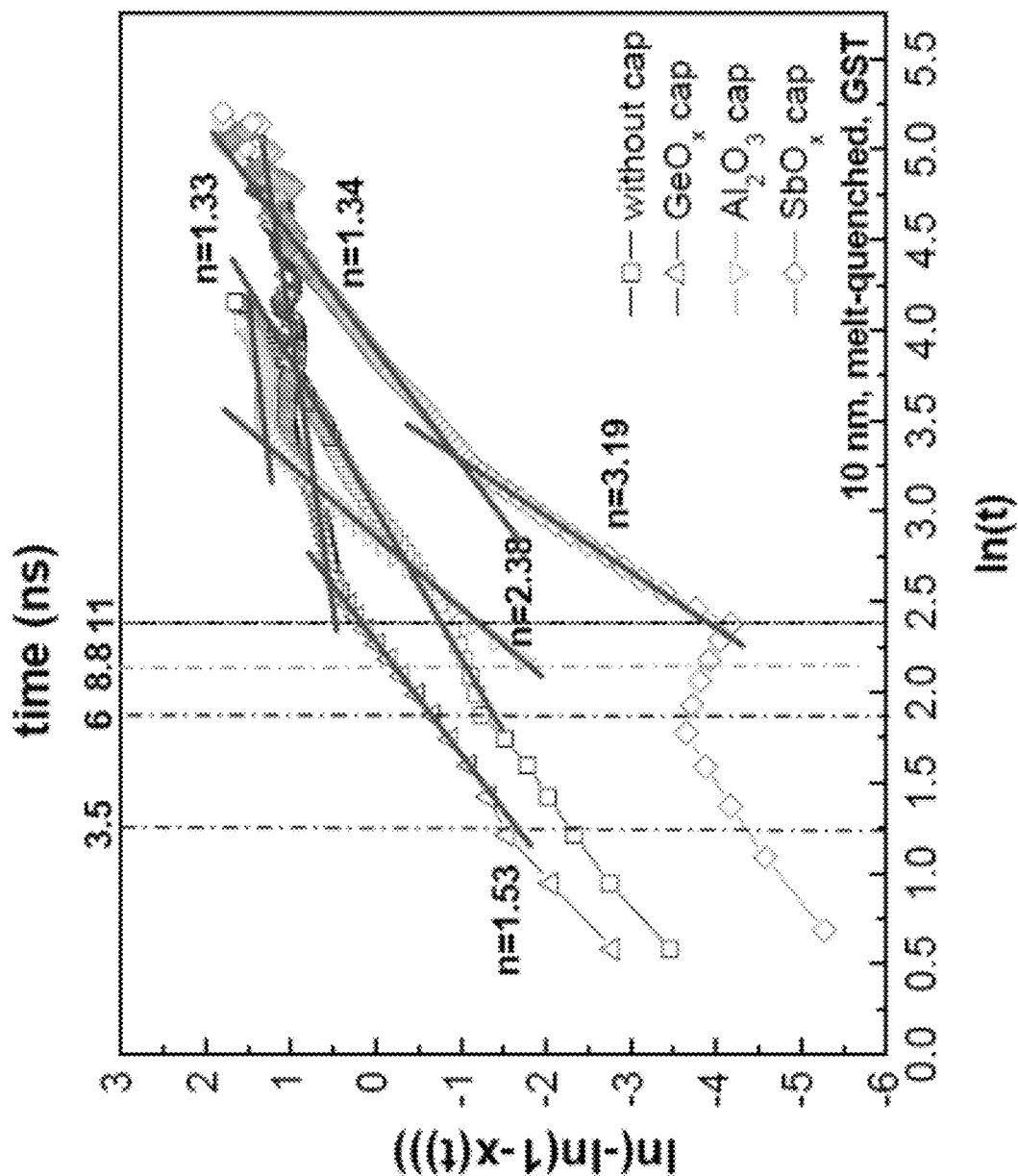

The JMAK plots for the re-crystallization of 30 nm and 10 nm melt-quenched, amorphous GST as a function of capping materials is shown in FIGS. 10A and 10B. Shown are the JMAK plots with $GeO_x$, $Al_2O_3$ and $SbO_x$ interfaces as a comparison to the uncapped GST samples. The JMAK plots for other capping materials, such as $SiO_2$, TiN and Al are very similar to some of them. For 30 nm melt-quenched, amorphous GST sample an incubation time for re-crystallization was found. All of the samples, including uncapped GST, show the same slope during the incubation and different slopes in JMAK plots after this time. This short incubation time of a few nanoseconds might be related to the heating time since it takes a few nanoseconds for the multilayer stack to reach thermal equilibrium and a constant temperature. When the thickness is reduced to 10 nm, the incubation time for GST with these interfaces decreases. The incubation for a $GeO_x$ interface decrease from 15 ns to 3.5 ns, even shorter than uncapped GST, which is fixed at 6 ns when film reduced from 30 nm to 10 nm. These results show clearly that the crystallization of melt-quenched, amorphous GST is strongly affected by interfaces with different capping materials as well as GST film thickness. Even though the crystals can grow from the boundary between the melt-quenched area and crystalline area resulting in a faster re-crystallization time in melt-quenched, amorphous samples than as-deposited, samples; an incubation time for melt-quenched, amorphous GST samples was still observed that also depended on the capping materials. Interestingly, the incubation time always increases with film thickness for as-deposited, amorphous GST; while it shows an opposite trend for melt-quenched, amorphous GST films. The change of n values for 30 nm melt-quenched, uncapped GST and GST with $GeO_x$ and $Al_2O_3$ capping materials show a typical crystallization behavior (n from ~3 to 1); while the GST with an $SbO_x$ interface had a fixed n value throughout the whole crystallization period indicating a different crystallization mechanism. The similar trends were also observed in 10 nm melt-quenched, GST capped with different materials as shown in FIG. 10B.

It was found that the interface layer changes the local structure of the nearest neighbors of the Ge atoms in the GeBiTe recording material and leads to slightly different coordination number as well. Therefore, changes of electronic states at interfaces would be a possible reason for their role as crystallization promoter or inhibitor. See T. Nakai, M. Yoshiki, Y. Satoh and S. Ashida, Jpn. J. Appl. Phys. 47, 5770 (2008); T. Nakai, M. Yoshiki and N. Ohmachi, Jpn. J. Appl. Phys. 46, 5770 (2007).

C. Crystallization Temperatures of GST as a Function of Capping Layer

Figure 11:
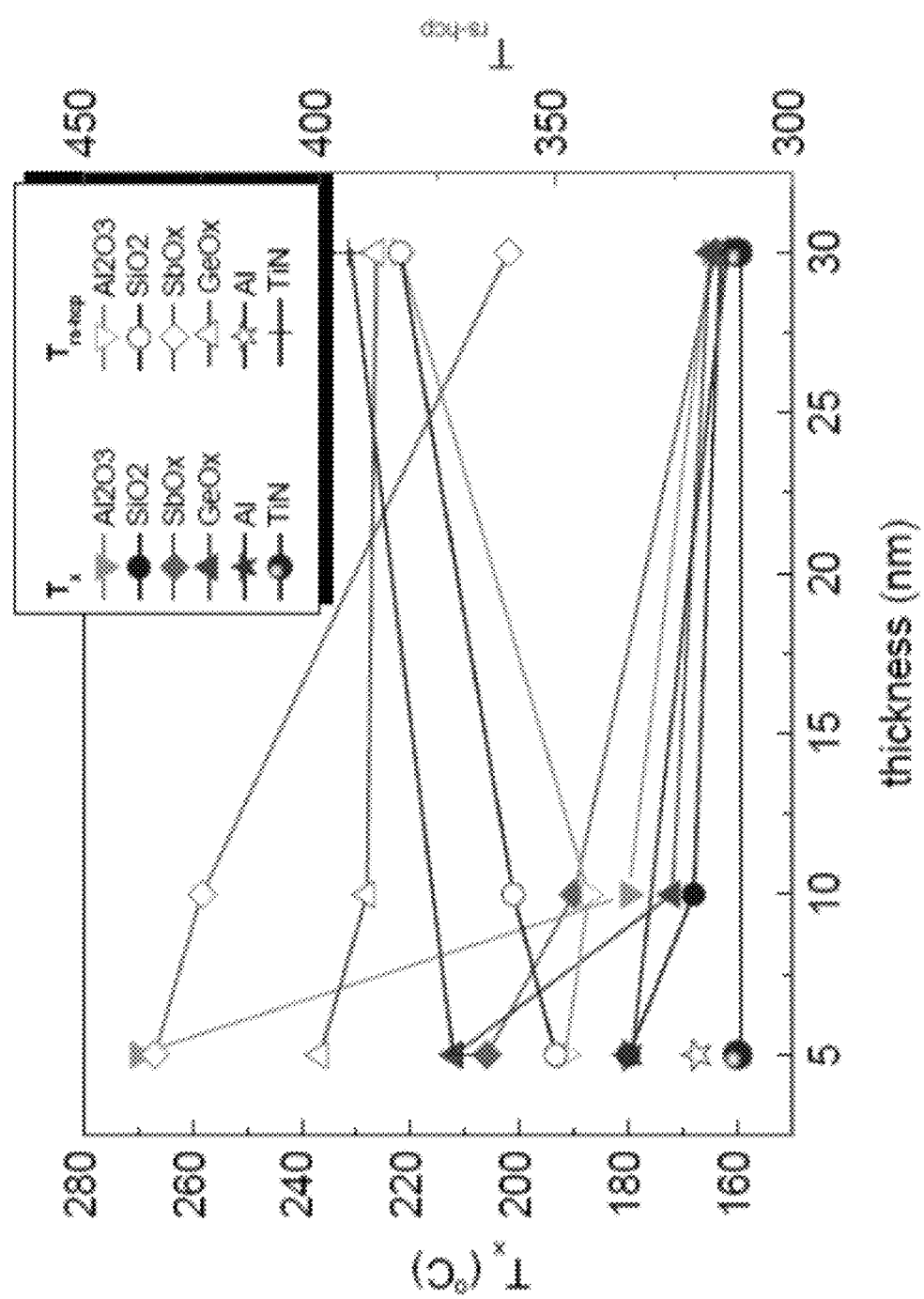
FIG. 11 is a plot of crystallization temperature $T_x$ and rocksalt to hexagonal transition temperature $T_{rs-hcp}$ as a function of film thickness d for GST thin films for various cladding layer (cap) materials.

FIG. 11 summarizes the effect of the capping materials and film thickness d on Tx and Trs-hex (rocksalt to hexagonal transition temperatures). Tx varies by 5° C. and Trs-hex by 35° C. (with the lowest Trs-hex for $SbO_x$ interface) as a function of capping material for 30 nm GST. The influence of the capping materials on Tx is relatively weak for these thick films. It was observed that the Al capping layer suppressed the hexagonal phase formation for 30 nm GST. A very similar result was observed for Al doped GST films. See S. Wei, J. Li, X. Wu, P. Zhou, S. Wang, Y. Zheng, L. Chen, F. Gan, X. Zhang and G. Li, Optics Express 15, 10584 (2007). When film thickness is reduced to 10 nm, Tx varies by 18° C. and Trs-hex by a 2° C. (lowest Tx for $SiO_2$ interface, highest Trc-hex for $SbO_x$ interface). When film thickness was reduced to 5 nm, Tx was increased for all of the capping materials we studied, and the $Al_2O_3$ interface showed the largest increase (by 120° C.). Interestingly, also the Al interface showed an increase in Tx for GST material compared to Ge—Sb, discussed below, where it led to a decrease in Tx. See Y. C. Chen, C. T. Rettner, S. Raoux, G. W. Burr, S. H. Chen, R. M. Shelby, M. Saling a, W. P. Risk, T. D. Happ, G. McClelland, M. Breitwisch, A. Schrott, J. B. Philipp, M. H. Lee, R. Cheek, T. Nirschl, M. Lamorey, C. F. Chen, E. Joseph, S. Zaidi, B. Yee, H. L. Lung, R. Bergmann, and C. Lam, IEDM Technical Digest, p. 777-780 (2006). In addition, Trs-hex varied by 115° C. for these thinner films (with a highest Trs-hex for the $SbO_x$ interface). There is very little correlation between Tx, Trs-hex and the crystallization time, except for the $SbO_x$ interface, which showed the longest re-crystallization time and the highest Tx and Trs-hex.

As shown in FIG. 12, increase in recrystallization temperatures Tx can also occur using other phase change materials, for example GeSb. Tx is shown increasing with reduction of film thickness for some cladding materials (e.g. Si, SiN, SiC, TiN and Pt); while it shows opposite trend for other cladding materials studied (e.g. Al and W). Interestingly, the Al interface showed an increase in $T_x$ for GST material compared to Ge—Sb where it led to a decrease in $T_x$. Therefore, it is seen that the properties are sample specific.

For the development of phase-change memory technology, the design of a suitable materials system is an important issue. The switching speed and thermal stability are very important parameters that can influence the viability of a technology. A key aspect of the invention is the recognition that it is possible to reduce recrystallization times by the appropriate choice of the interface materials and the phase change material, the thickness of the phase change material (e.g. crystallization time<15 ns using a $GeO_x$ capping layer for 10 nm GST) Thinner phase change films may provide the additional benefit of high Tx (e.g. Tx ~212° C. for 5 nm GST) for better thermal stability.

Figure 13:
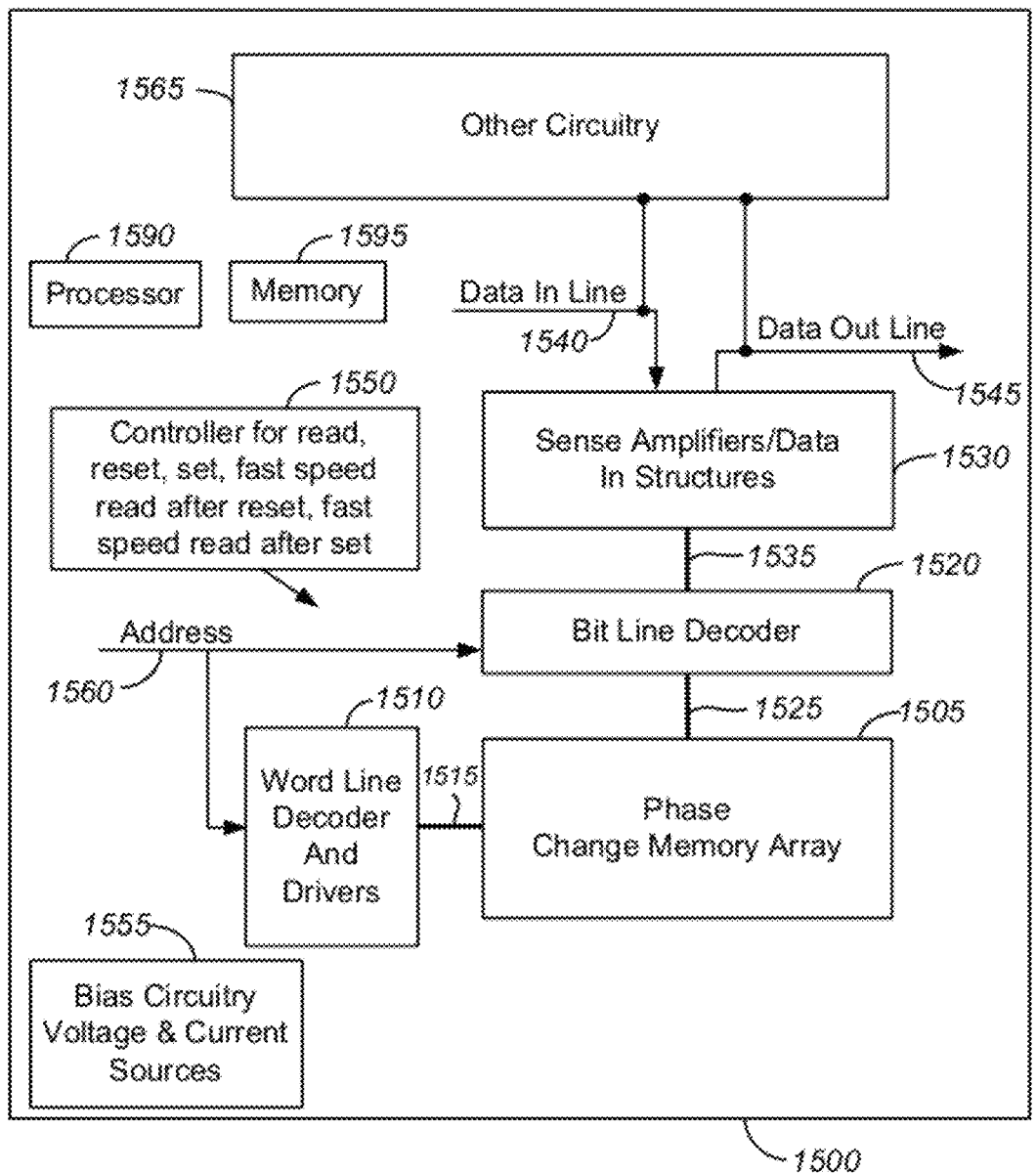
FIG. 13 is a simplified block diagram of an integrated circuit in which the operations described herein can be implemented.

FIG. 13 is a simplified block diagram of an integrated circuit 1500 in which the various operations can be implemented. The integrated circuit 1500 includes a memory array 1505 of memory cells having phase change memory elements programmable to a plurality of resistance states including a lower resistance state and a higher resistance state. A word line decoder 1510 having read, reset and set modes is coupled to and in electrical communication with a plurality of word lines 1515 arranged along rows in the memory array 1505. A bit line (column) decoder 1520 is in electrical communication with a plurality of bit lines 1525 arranged along columns in the array 1505 for reading and programming the memory cells (not shown) in array 1505.

Addresses are supplied on bus 1560 to word line decoder and drivers 1510 and bit line decoder 1520. Sense circuitry (sense amplifiers) and data-in structures in block 1530, including voltage and/or current sources for the read and program modes, are coupled to bit line decoder 1520 via data bus 1535. Data is supplied via a data-in line 1540 from input/output ports on integrated circuit 1500, or from other data sources internal or external to integrated circuit 1500, to data-in structures in block 1530. Other circuitry 1565 may be included on integrated circuit 1500, such as a general purpose processor or special purpose application circuitry, or a combination of modules providing system-on-a-chip functionality supported by array 1505. Data are supplied via a data-out line 1545 from the sense amplifiers in block 1530 to input/output ports on integrated circuit 1500, or to other data destinations internal or external to integrated circuit 1500.

The integrated circuit 1500 includes a controller 1550 for read, reset and set modes of the memory cells of the array 1505. The controller 1550, implemented in this example using a bias arrangement state machine, controls the application of bias circuitry voltage and current sources 1555 for the application of bias arrangements including read, set and reset to the word lines 1515, bit lines 1525, and in some embodiments source lines. Controller 1550 may be implemented using special-purpose logic circuitry as known in the art. In alternative embodiments, controller 1550 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1550.

The integrated circuit 1500 includes one or more central processing units, which are arranged to execute instructions stored in program memory 1595 including instructions to control operations of the array 1505 for applying the pulses of the operations described herein to the phase change memory cells of the array 1505.

Figure 14:
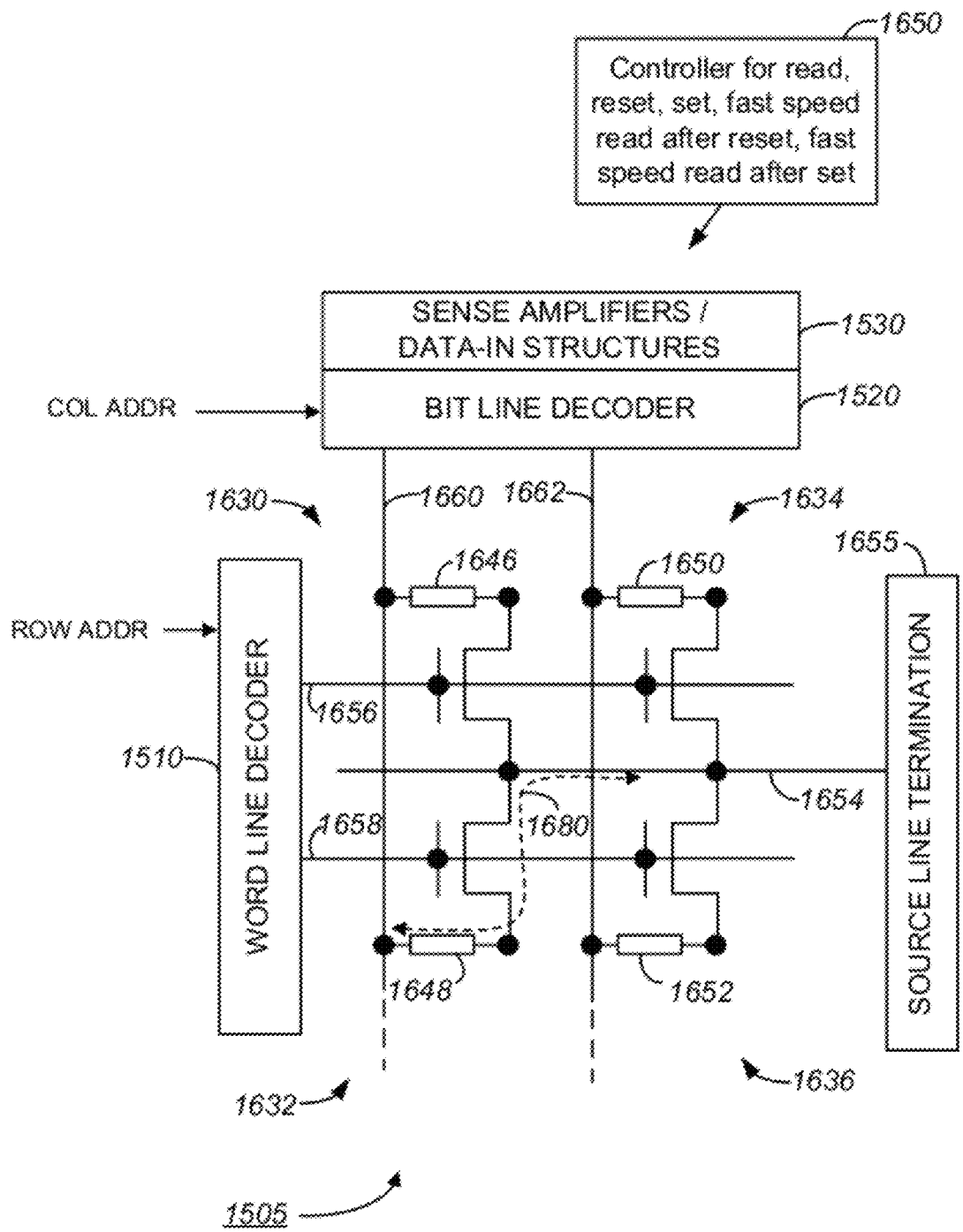
FIG. 14 is a schematic diagram of a portion of the memory array of the integrated circuit of FIG. 13.

As shown in FIG. 14, each of the memory cells of array 1505 includes an access transistor (or other access device such as a diode) and a phase change memory element. In FIG. 14 four memory cells 1646, 1648, 1650 and 1652 having respective memory elements 1640, 1642, 1644, 1646 are illustrated, representing a small section of an array that can include millions of memory cells. The memory elements are programmable to a plurality of resistance states including a lower and a higher resistance state.

Sources of each of the access transistors of memory cells 1646, 1648, 1650 and 1652 are connected in common to source line 1654 that terminates in source line termination circuit 1655, such as a ground terminal. In another embodiment the source lines of the access devices are not electrically connected, but independently controllable. The source line termination circuit 1655 may include bias circuitry such as voltage sources and current sources, and decoding circuits for applying bias arrangements, other than ground, to the source line 1654 in some embodiments.

A plurality of word lines including word lines 1656, 1658 extend in parallel along a first direction. Word lines 1656, 1658 are in electrical communication with word line decoder 1510. The gates of access transistors of memory cells 1646 and 1650 are connected to word line 1656, and the gates of access transistors of memory cells 1648 and 1652 are connected in common to word line 1658.

A plurality of bit lines including bit lines 1660, 1662 extend in parallel in a second direction and are in electrical communication with bit line decoder 1520. In the illustrated embodiment each of the memory elements are arranged between the drain of the corresponding access device and the corresponding bit line. Alternatively, the memory elements may be on the source side of the corresponding access device.

It will be understood that the memory array 1605 is not limited to the array configuration illustrated in FIG. 14, and additional array configurations can also be used. Additionally, instead of MOS transistors, bipolar transistors may be used as access devices.

In operation each of the memory cells in the array 1605 store data depending upon the resistance of the corresponding memory element. The data value may be determined, for example, by comparison of current on a bit line for a selected memory cell to that of a suitable reference current by sense amplifiers of sense circuitry 1530. The reference current can be established so that a predetermined range of currents correspond to a logical "0", and a differing range of currents correspond to a logical "1". In a memory cell having three or more states, reference currents can be established so that differing ranges of bit line currents correspond to each of the three or more states.

Reading, or writing to a memory cell of array 1605 can be achieved by applying a suitable voltage to one of word lines 1656, 1658 and coupling one of bit lines 1660, 1662 to a voltage so that current flows through the selected memory cell. For example, a current path 1680 through a selected memory cell (in this example memory cell 1832 and corresponding memory element 1648) is established by applying voltages to the bit line 1660, word line 1658, and source line 1654 sufficient to turn on the access transistor of memory cell 1632 and induce current in path 1680 to flow from the bit line 1660 to the source line 1654, or vice-versa. The level and duration of the voltages applied is dependent upon the operation performed.

In a read (or sense) operation of memory cell 1632, word line decoder 1510 facilitates providing word line 1658 with a suitable voltage to turn on the access transistor of the memory cell 1632. Bit line decoder 1520 facilitates supplying a voltage to bit line 1660 of suitable amplitude and duration to induce current to flow that does not result in the memory element 1648 undergoing a change in resistive state. The current on the bit line 1660 and through the memory element 1648 is dependent upon the resistance of, and therefore the data state associated with, the memory element 1648 of the memory cell 1632. Thus, the data state of the memory cell may be determined, for example by comparison of the current on bit line 1660 with a suitable reference current by sense amplifiers of sense circuitry 1530.

In a reset operation of a data value to be stored in the memory cell 1632, bias circuitry voltage and current sources 1555 coupled to the array 1505 applies a reset bias arrangement as described herein comprising one or more pulses to the bit line 1660 and/or word line 1658 and/or source line 1654 to induce current in path 1680. The resultant pulses of across the memory element 1648 change the resistance state of the memory element 1648 from the lower resistance state to the higher resistance state.

In a set operation of a data value to be stored in the memory cell 1632, bias circuitry voltage and current sources 1555 coupled to the array 1505 applies a set bias arrangement as described herein comprising one or more pulses to the bit line 1660 and/or word line 1658 and/or source line 1654 to induce current in path 1680. The resultant pulses across the memory element 1648 change the resistance state of the memory element 1648 from the higher resistance state to the lower resistance state.

Embodiments of the memory cells described herein include phase change based memory materials, including chalcogenide based materials and other materials, for the memory elements. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an N2 ambient is optionally performed to improve the crystallized state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

Any and all patents, patent applications and printed publications referred to above are incorporated by reference.

The invention claimed is:

1. A method for determining manufacturing parameters for the manufacture of a memory cell device, the method comprising:
   (a) selecting GST as a phase change material;
   (b) selecting a buffer layer material;
   (c) selecting a cladding layer material;
   (d) depositing the buffer layer material on a substrate to a buffer layer material thickness;
   (e) depositing the phase change material on the buffer layer to a phase change material thickness;
   (f) depositing the cladding layer material on the phase change material to a cladding layer material thickness to form a memory cell element;
   (g) forming a conductive structure to electrically connect with the phase change material;

(h) passing electric current through the phase change material;
(i) determining the recrystallization time of the phase change material of the memory cell element; and
(j) if the determined recrystallization time is not less than a length of time X, then repeat steps (a)-(j) with the phase change material depositing step comprising depositing a thinner layer of the phase change material thereby reducing the thickness of the phase change material.

2. The method according to claim 1, wherein the buffer layer material selecting step comprises selecting $Al_2O_3$ as the buffer layer material.

3. The method according to claim 1, further comprising selecting a cladding layer material that is different from the buffer layer material.

4. The method according to claim 1, wherein the buffer layer material depositing step comprises depositing the buffer layer material to a buffer layer material thickness of about 10 to 30 nm.

5. The method according to claim 1, wherein the phase change material depositing step comprises depositing the phase change material to a phase change material thickness of less than 10 nm.

6. The method according to claim 1, wherein the cladding material layer depositing step comprises depositing the cladding layer material to a thickness of about 5 to 10 nm.

7. A method according to claim 1, wherein step i is carried out with the time X being about 40 ns.

8. The method according to claim 1, wherein if the determined recrystallization time is not less than a length of time X, then repeat steps (a)-(j) using a changed buffer layer material.

9. The method according to claim 1, wherein if the determined recrystallization time is not less than a length of time X, then repeat steps (a)-(j) using a changed cladding material.

* * * * *